(12) United States Patent
Kojima et al.

(10) Patent No.: US 9,372,416 B2
(45) Date of Patent: Jun. 21, 2016

(54) METHOD FOR MANUFACTURING ELECTROPHOTOGRAPHIC PHOTOSENSITIVE MEMBER

(75) Inventors: Satoshi Kojima, Yokohama (JP); Kazunari Ooyama, Numazu (JP); Yukihiro Abe, Mishima (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/608,843

(22) Filed: Sep. 10, 2012

(65) Prior Publication Data
US 2013/0065177 A1 Mar. 14, 2013

(30) Foreign Application Priority Data

Sep. 12, 2011 (WO) .................. PCT/JP2011/070695

(51) Int. Cl.
| | |
|---|---|
| *G03G 5/082* | (2006.01) |
| *G03G 5/043* | (2006.01) |
| *C23C 16/24* | (2006.01) |
| *C23C 16/32* | (2006.01) |
| *C23C 16/515* | (2006.01) |
| *H01J 37/32* | (2006.01) |

(52) U.S. Cl.
CPC .............. *G03G 5/0433* (2013.01); *C23C 16/24* (2013.01); *C23C 16/325* (2013.01); *C23C 16/515* (2013.01); *G03G 5/08214* (2013.01); *G03G 5/08278* (2013.01); *H01J 37/32018* (2013.01); *H01J 37/32036* (2013.01); *H01J 37/3244* (2013.01); *H01J 37/32449* (2013.01); *H01J 37/32715* (2013.01)

(58) Field of Classification Search
CPC ............ G03G 5/0433; G03G 5/08214; G03G 5/08278

USPC ......................... 430/57, 63, 66, 128; 399/159
See application file for complete search history.

(56) References Cited

U.S. PATENT DOCUMENTS

| | | | | |
|---|---|---|---|---|
| 5,439,715 | A | * | 8/1995 | Okamura et al. .............. 427/575 |
| 5,582,944 | A | * | 12/1996 | Yamamura et al. ............. 430/66 |
| 5,849,455 | A | * | 12/1998 | Ueda et al. ..................... 430/128 |
| 2007/0046170 | A1 | * | 3/2007 | Ono et al. ..................... 313/491 |
| 2008/0003016 | A1 | * | 1/2008 | Nakano .......................... 399/159 |
| 2009/0078566 | A1 | * | 3/2009 | Ikeda et al. ............... 204/192.25 |

FOREIGN PATENT DOCUMENTS

| | | |
|---|---|---|
| EP | 0717127 A2 | 6/1996 |
| JP | 02-061069 A | 3/1990 |
| JP | 06-002153 A | 1/1994 |

(Continued)

*Primary Examiner* — Peter Vajda
*Assistant Examiner* — Olatunji Godo
(74) *Attorney, Agent, or Firm* — Canon USA, Inc., IP Division

(57) ABSTRACT

A method for manufacturing an electrophotographic photosensitive member using plasma CVD includes steps of placing a cylindrical base member in a reactor which can be evacuated, the reactor having an electrode therein, so as to be spaced apart from the electrode, introducing a raw material gas for deposited film formation into the reactor, and applying an alternating voltage of a rectangular wave having a frequency in the range of 3 kHz to 300 kHz between the electrode and the cylindrical base member so that a potential at one of the electrode and the cylindrical base member with respect to a potential at the other becomes alternately positive and negative, to decompose the raw material gas, and forming a deposited film on the cylindrical base member. The magnitude of the potential difference between the electrode and the cylindrical base member is selectively controlled.

8 Claims, 11 Drawing Sheets

(56) References Cited

FOREIGN PATENT DOCUMENTS

| JP | 08-222519 | A | 8/1996 |
| JP | 2001-067657 | A | 3/2001 |
| JP | 2002-212727 | A | 7/2002 |
| WO | 2006/134781 | A1 | 12/2006 |

* cited by examiner

METHOD FOR MANUFACTURING ELECTROPHOTOGRAPHIC PHOTOSENSITIVE MEMBER

TECHNICAL FIELD

The present invention relates to a method for manufacturing an electrophotographic photosensitive member using a plasma CVD (chemical vapor deposition) method.

BACKGROUND ART

Conventionally, an electrophotographic photosensitive member containing amorphous silicon (hereinafter also referred to as "a-Si") is manufactured by forming deposited films such as a photoconductive layer on a cylindrical base member. Deposited film forming methods, which have been widely used, include a method of decomposing a raw material gas for deposited film formation using an RF band high-frequency glow discharge and attaching the decomposed products to the cylindrical base member, called an RF plasma CVD method.

Demand for improved image quality of electrophotographic devices has increased in recent years, and an improved uniformity of deposited films of an electrophotographic photosensitive member (thickness and quality uniformity of deposited films) and improved characteristics of the deposited films have been increasingly demanded accordingly.

In the conventional RF plasma CVD method, because of the frequency being high, standing waves may be produced in accordance with the wavelength to form a low-electric-field portion in a plasma, or propagation variation due to the impedance of the plasma CVD device to be used may cause a non-uniformity in plasma, which makes the improvement of the uniformity of deposited films a challenge. In addition, since the electric field to be used is an alternating electric field, charged particles (ions and electrons) in a plasma reciprocate due to the electric field, and may, during reciprocation, undergo a secondary reaction with other charged particles, neutral active species, or raw material gases to become powdery matter. The powdery matter is taken into deposited films, which makes the improvement of the characteristics of the deposited films a challenge.

Among the above challenges, in terms of the improvement of the uniformity of deposited films, the use of low-frequency glow discharge, on which the influence of standing waves or the impedance of the plasma CVD device is reduced, has been studied. In terms of the improvement of the characteristics of deposited films, in order to prevent secondary reactions in a plasma, adjusting all the voltages to have either positive or negative polarity, that is, applying only voltages of either polarity and causing the voltages to discharge, has been studied. Hereinafter, applying only voltages of either positive or negative polarity and causing the voltages to discharge is referred to as "unipolar discharge", and alternately applying voltages of both positive and negative polarities and causing the voltages to discharge is referred to as "bipolar discharge".

PTL 1 discloses a technology in which rectangular wave voltages of only either positive or negative polarity whose frequency is not more than 300 kHz is used. According to PTL 1, a low frequency of 300 kHz or less improves the uniformity of deposited films. Furthermore, bipolar discharge as disclosed in PTL 2 may cause the secondary reaction described above even if the frequency is not more than 300 kHz, whereas unipolar discharge would allow charged particles (ions and electrons) to move only in one direction and therefore prevent the secondary reaction described above.

CITATION LIST

Patent Literature

PTL 1: WO2006/134781
PTL 2: Japanese Patent Laid-Open No. 2001-067657

However, as a result of the study conducted by the present inventors, it has been found that there remains room for image defect levels to be improved when an electrophotographic photosensitive member manufactured using the technology disclosed in PTL 1 is used in an electrophotographic device. This is considered to result from the fact that since the technology disclosed in PTL 1 employs unipolar discharge, charged particles of only either positive or negative polarity mainly reach the cylindrical base member, resulting in charge-up of the cylindrical base member. The charge-up of the cylindrical base member is more specifically charge-up of a surface of the cylindrical base member on which deposited films are formed (≅ the surface of the deposited films). While such charge-up of the cylindrical base member occurs across the entirety of the cylindrical base member, the degree of charge-up differs from location to location due to the small difference in the characteristics of the deposited films or in the surface shape of the deposited films. Thus, the difference in electric field caused by the difference in the degree of charge-up is produced on the cylindrical base member, and a minute spark is likely to occur. Due to electrical damage caused by the spark, the characteristics of the deposited films may be locally reduced or slight separation of the deposited films (hereinafter also referred to as "film separation") may occur. If slight film separation occurs, the corresponding part appears as an image defect when the electrophotographic photosensitive member is used in an electrophotographic device. The term image defect is used here to include a white point appearing on a solid black (when toner of a color other than black is used, "solid black" is also used for convenience) image and a black point (when toner of a color other than black is used, "black point" is also used for convenience) appearing on a solid white image, which is called a "spot". In addition, even if slight film separation occurs in the vicinity of the cylindrical base member, separated film pieces are attached to the cylindrical base member. This triggers the occurrence of a film defect on the deposited films to be formed on the cylindrical base member, which may also lead to an image defect (spot). The term film defect is used here to refer to a portion where the characteristics of the deposited films are locally reduced by electrical damage caused by a minute spark, a slight film separation portion of the deposited films formed on the cylindrical base member due to a minute spark, or a projection caused by attaching a separated film piece to the cylindrical base member.

The above adverse effects caused by charge-up are not sufficiently addressed by setting the value of the low-voltage portion of the rectangular wave in the technology disclosed in PTL 1 to 0 V and intermittently stopping the incidence of charged particles on the cylindrical base member. The adverse effects caused by charge-up can be addressed by using the bipolar discharge as disclosed in PTL 2; however, the secondary reaction described above is likely to occur, resulting in a reduction in the characteristics of the deposited films.

As above, a method for manufacturing an electrophotographic photosensitive member using a plasma CVD method based on low-frequency rectangular wave voltages, in which high levels of prevention of charge-up and prevention of secondary reactions are achieved, has not been conventionally found.

It is an object of the present invention to provide a method for manufacturing an electrophotographic photosensitive member, wherein high levels of prevention of charge-up and prevention of secondary reactions are achieved.

SUMMARY OF INVENTION

The present invention provides a method for manufacturing an electrophotographic photosensitive member, including the steps of:

(i) placing a cylindrical base member in a reactor which can be evacuated, the reactor having an electrode therein, so as to be spaced apart from the electrode;

(ii) introducing a raw material gas for deposited film formation into the reactor; and (iii) applying an alternating voltage of a rectangular wave having a frequency of 3 kHz or more and 300 kHz or less between the electrode and the cylindrical base member so that a potential at one of the electrode and the cylindrical base member with respect to a potential at the other becomes alternately positive and negative, to decompose the raw material gas, and forming a deposited film on the cylindrical base member, wherein one of the absolute value of the potential difference between the electrode and the cylindrical base member when a potential at one of the electrode and the cylindrical base member with respect to a potential at the other becomes positive and the absolute value of the potential difference between the electrode and the cylindrical base member when a potential at one of the electrode and the cylindrical base member with respect to a potential at the other becomes negative is a value (V1) less than the absolute value of a discharge maintaining voltage, and the other is a value (V2) greater than or equal to the absolute value of a discharge starting voltage.

Further features of the present invention will become apparent from the following description of exemplary embodiments with reference to the attached drawings.

DESCRIPTION OF EMBODIMENTS

The present invention provides a method for manufacturing an electrophotographic photosensitive member using a plasma CVD method, including the steps of:

(i) placing a cylindrical base member in a reactor which can be evacuated, the reactor having an electrode therein, so as to be spaced apart from the electrode;

(ii) introducing a raw material gas for deposited film formation into the reactor; and (iii) applying an alternating voltage of a rectangular wave having a frequency of 3 kHz or more and 300 kHz or less between the electrode and the cylindrical base member so that a potential at one of the electrode and the cylindrical base member with respect to a potential at the other becomes alternately positive and negative, to decompose the raw material gas, and forming a deposited film on the cylindrical base member, wherein one of the absolute value of the potential difference between the electrode and the cylindrical base member when a potential at one of the electrode and the cylindrical base member with respect to a potential at the other becomes positive and the absolute value of the potential difference between the electrode and the cylindrical base member when a potential at one of the electrode and the cylindrical base member with respect to a potential at the other becomes negative is a value (V1) less than the absolute value of a discharge maintaining voltage, and the other is a value (V2) greater than or equal to the absolute value of a discharge starting voltage.

Figure 1A:
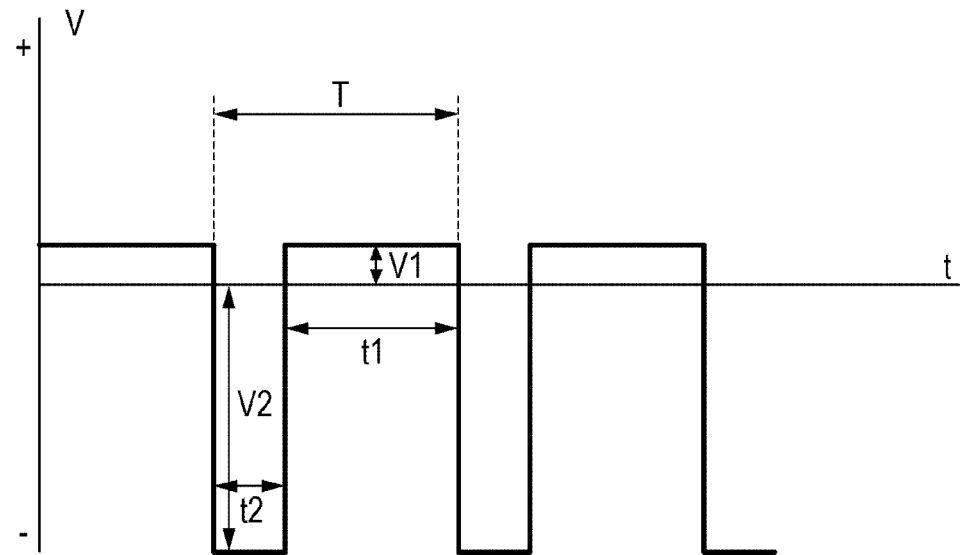
FIG. 1A is a diagram depicting an alternating voltage of a rectangular wave.
Figure 1B:
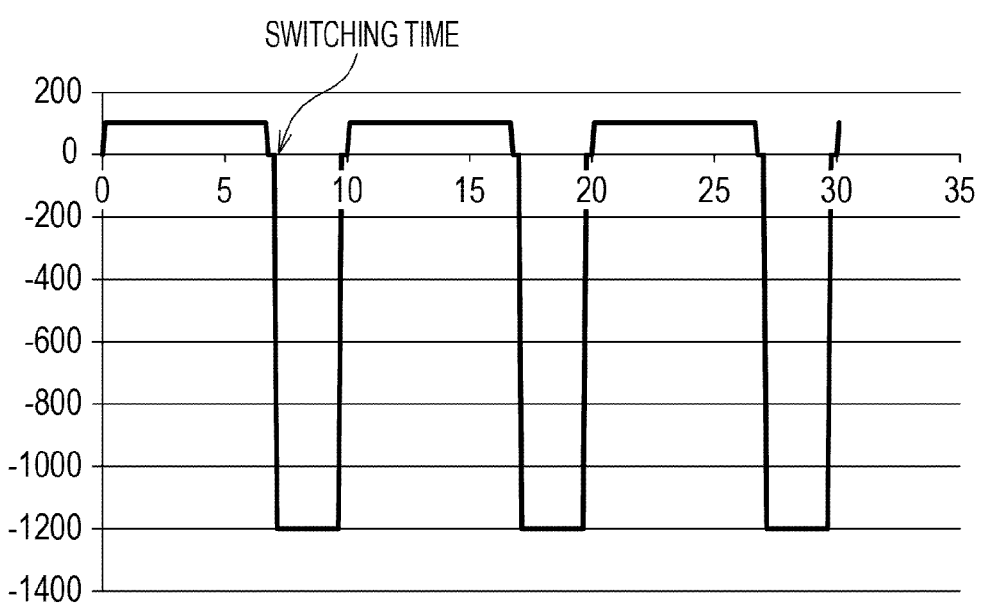
FIG. 1B is a diagram depicting an alternating voltage of a rectangular wave.

FIGS. 1A and 1B are diagrams depicting an alternating voltage of a rectangular wave.

FIG. 1A is a diagram illustrating changes in the potential at a cylindrical base member when an alternating voltage of a rectangular wave is applied between an electrode and the cylindrical base member so that the potential at the cylindrical base member with respect to the potential at the electrode becomes alternately positive and negative, where the potential at the electrode is made constant to the ground potential. In the example in FIG. 1A, the absolute value of the potential difference between the electrode and the cylindrical base member when the potential at the cylindrical base member with respect to the potential at the electrode becomes positive is equal to a value (V1) less than the absolute value of the discharge maintaining voltage, and the absolute value of the potential difference between the electrode and the cylindrical base member when the potential at the cylindrical base member with respect to the potential at the electrode becomes negative is equal to a value (V2) greater than or equal to the absolute value of the discharge starting voltage. In the example in FIG. 1A, since the potential at the electrode is made constant, the potential at the cylindrical base member changes rectangularly in the manner illustrated in FIG. 1A.

In FIG. 1A, T represents the period of the rectangular wave, and is determined by the frequency (pulse frequency) of the rectangular wave. In the present invention, a rectangular wave having a frequency of 3 kHz or more and 300 kHz or less is used, and, preferably, a rectangular wave having a frequency of 10 kHz or more and 100 kHz or less is used. In FIG. 1A, furthermore, t1 represents the time (period) during which the absolute value of the potential difference between the electrode and the cylindrical base member is V1, and t2 represents the time (period) during which the absolute value of the potential difference between the electrode and the cylindrical base member is V2. In the present invention, furthermore, the value obtained by dividing t2 by T (t2/T) is defined as duty ratio (%). In the example in FIG. 1A, the duty ratio is set to 30%.

The alternating voltage of the above rectangular wave can be obtained by causing a voltage such that the absolute value of the potential difference between the electrode and the cylindrical base member when the potential at the cylindrical base member with respect to the potential at the electrode becomes positive is V1, and a voltage such that the absolute value of the potential difference between the electrode and the cylindrical base member when the potential at the cylindrical base member with respect to the potential at the electrode becomes negative is V2 to be generated from a DC power supply to control turning ON/OFF of a switching element, and by changing the voltage from the DC power supply into time-division pulses. Examples of the switching element include semiconductor switching elements such as IGBT (Insulated Gate Bipolar Transistor) and MOSFET. These switching elements can also change the duty ratio or the frequency.

Figure 2A:
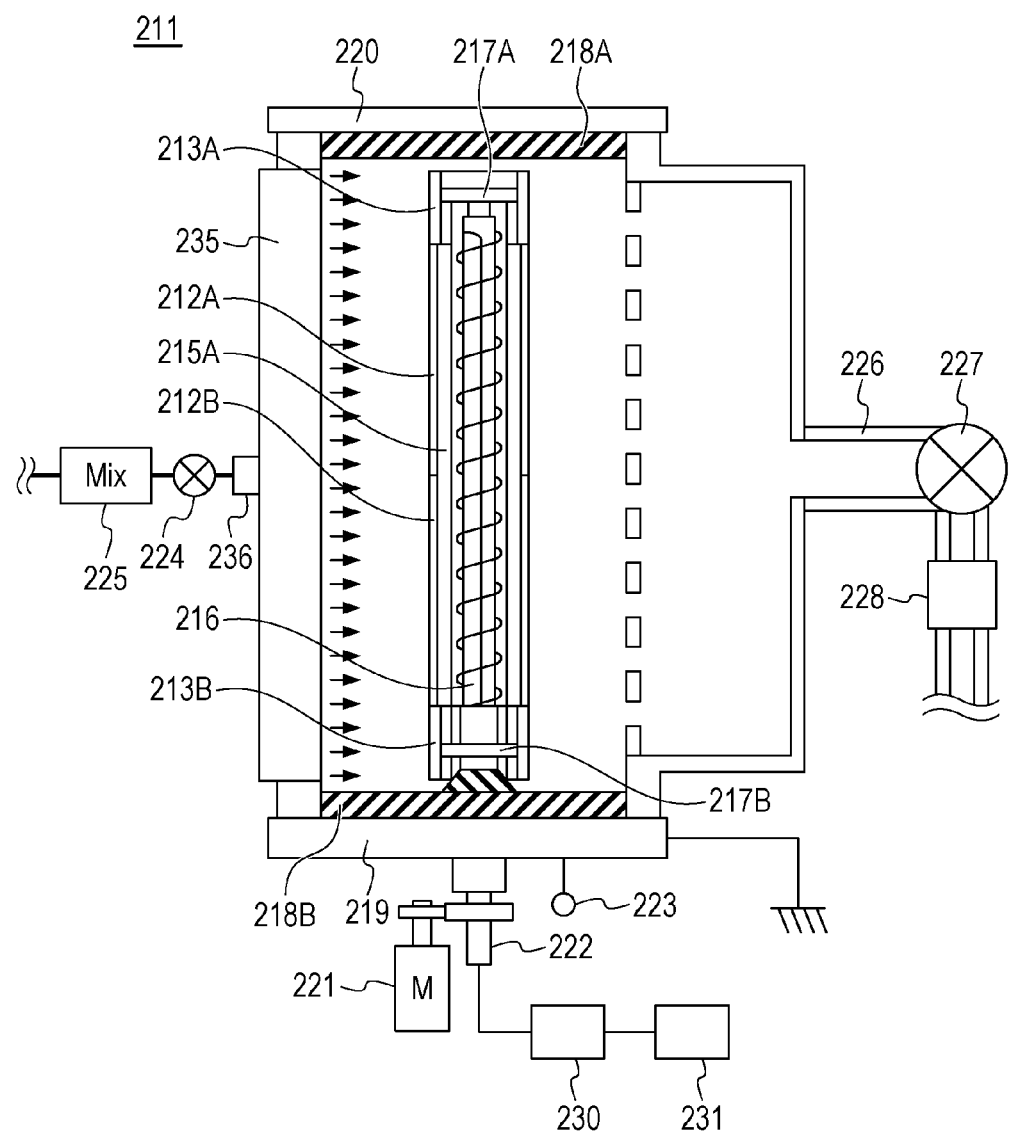
FIG. 2A is a schematic diagram illustrating an example of a manufacturing device (plasma CVD device) for carrying out a method for manufacturing an electrophotographic photosensitive member according to the present invention.
Figure 2B:
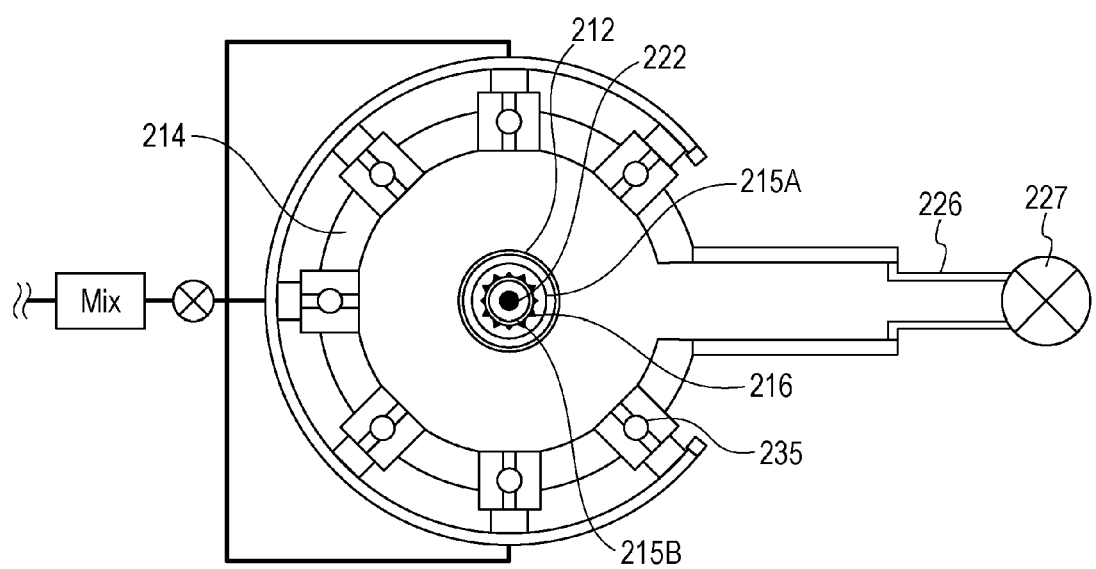
FIG. 2B is a schematic diagram illustrating an example of a manufacturing device (plasma CVD device) for carrying out a method for manufacturing an electrophotographic photosensitive member according to the present invention.

FIGS. 2A and 2B (hereinafter also referred to collectively as "FIG. 2") are schematic diagrams illustrating an example of a manufacturing device (plasma CVD device) for carrying out a method for manufacturing an electrophotographic photosensitive member according to the present invention. FIG. 2A is a longitudinal cross-sectional view, and FIG. 2B is a lateral cross-sectional view. In the plasma CVD device illustrated in FIG. 2, an alternating voltage of a rectangular wave having a frequency of 3 kHz or more and 300 kHz or less is applied between an electrode 214 and a cylindrical base member 212 (212A, 212B) so that the potential at the cylindrical base member 212 (212A, 212B) with respect to the potential at the electrode 214 becomes alternately positive and negative to decompose a raw material gas, and deposited films can be formed on the cylindrical base member 212 (212A, 212B) (outer peripheral surface of the cylindrical base member 212).

An alternating voltage of a rectangular wave output from a power supply 231 and applied between the electrode 214 and the cylindrical base member 212 (212A, 212B), which is disposed away from the electrode 214, is controlled by the control unit 230 in terms of frequency, duty ratio, and so forth.

In the present invention, the frequency of the alternating voltage of the rectangular wave is set in a range of 3 kHz or more and 300 kHz or less, which is the VLF-to-LF range. If the frequency is too low, abnormal discharge including arc and spark is likely to occur, and film defects are likely to occur in the deposited films. If the frequency is too high, on the other hand, standing waves are produced in accordance with the wavelength to form a low-electric-field portion in a plasma, or propagation variation due to the impedance of the plasma CVD device causes a non-uniformity in plasma, and causes a reduction in the uniformity of the deposited films to be likely to occur.

In FIG. 1A, during the period t2, the absolute value of the potential difference between the electrode 214 and the cylindrical base member 212 (212A, 212B) is equal to the value (V2) that is greater than or equal to the absolute value of the discharge starting voltage. Thus, discharge occurs between the electrode 214 and the cylindrical base member 212 (212A, 212B), and a plasma is generated. The neutral active species and positive ions in the plasma reach the cylindrical base member 212 (212A, 212B), and deposited films are formed on the cylindrical base member 212 (212A, 212B). In this process, due to the positive charge carried by the positive ions, the cylindrical base member 212 (212A, 212B) is charged up to positive potential. The "plasma being generated" means that discharge occurs between an electrode and a cylindrical base member, the raw material gas is ionized, and charged particles (ions and electrons) are generated.

Then, in the period t1, the absolute value of the potential difference between the electrode 214 and the cylindrical base member 212 (212A, 212B) becomes less than the absolute value of the discharge maintaining voltage. Thus, the discharge disappears, and the plasma is not maintained. However, the charged particles (ions and electrons) generated during the period t2 do not disappear instantly, and survive for a while with gradual decay in the period t1. This state is generally called afterglow, and no charged particles (ions and electrons) are generated. The life of the afterglow is approximately several tens of microseconds to several milliseconds. The life of the afterglow depends upon the pressure. The higher the pressure, the more likely the particles are to collide with gas molecules and the like. Therefore, the life of the afterglow tends to decrease.

In this example, the potential at the cylindrical base member 212 (212A, 212B) with respect to the potential at the electrode 214 becomes positive in the afterglow state. Thus, the negative charged particles in the afterglow, that is, electrons and negative ions, reach the cylindrical base member 212 (212A, 212B). In this process, due to the negative charge carried by the electrons and negative ions, charge-up of the cylindrical base member 212 (212A, 212B) to positive potential is reduced.

In the present invention, reduced image defects are considered to result from such prevention of charge-up of the cylindrical base member and prevention of minute sparks.

No additional charged particles (ions and electrons) are generated in the afterglow, and the amount of charged particles in the afterglow is limited. Thus, the direction of movement of the charged particles (ions and electrons) generated during the period t2 is reversed in the period t1, and, though a secondary reaction caused by the reversal, matters that have an adverse effect on the characteristics of the deposited films are not generated. In addition, if the charged particles (ions and electrons) reach the cylindrical base member in the period t1, the charge-up of the cylindrical base member, which has been produced in the period t2, is reduced, and charge-up of the cylindrical base member to opposite polarity does not occur.

In the plasma CVD device illustrated in FIG. 2, furthermore, a voltage similar to that to the cylindrical base member 212 (212A, 212B) is also applied to a holder for holding the cylindrical base member 212 (212A, 212B) (hereinafter referred to as the "base member holder") 213. Thus, the above phenomenon, which is similar to that for the cylindrical base member 212 (212A, 212B), also occurs in the base member holder 213.

In FIG. 1A, the switching from V2 to V1 and the switching from V1 to V2 are illustrated to be performed instantly. In general commercial power supplies, due to the limitation on the power supply circuit characteristics, a certain amount of time is required for the switching from V2 to V1 and the switching from V1 to V2. The time required for the switching in general commercial power supplies is approximately less than or equal to 1 μs. As described above, the life of the afterglow is approximately several tens of microseconds to several milliseconds, and is longer than 1 μs, and therefore the time required for such switching has no effect on the advantages of the present invention. In addition, depending on the power supply, as illustrated in FIG. 1B, a period of time may be required at 0 V when switching from V2 to V1 occurs and when switching from V1 to V2 occurs. However, the period of time at 0 V is approximately 0.5 μs or less, and is sufficiently shorter than the life of the afterglow, thus having no effect on the advantages of the present invention.

In FIG. 1A, furthermore, a completely rectangular wave is illustrated. In general commercial power supplies, however, the edge portion of the rectangular wave may be rounded or may be slightly sharpened due to an overshoot, or ringing may occur when V1 or V2 is reached. In such cases, the advantages of the present invention can be achieved.

Next, the discharge starting voltage and the discharge maintaining voltage will be described in detail.

The discharge between the electrode and the cylindrical base member begins to take place by carrying electrons, a small amount of which exists between the electrode and the cylindrical base member, to the positive potential side by the electric field and causing the electrons to collide with gas molecules midway to ionize the gas molecules to make the α action to continue to generate electrons and ions. In order to induce ionization, the required energy of the electron at the collision time is greater than or equal to the ionization energy of the gas molecules. The energy required when the electrons collide with the gas molecules increases as the electric field increases, that is, as the voltage to be applied between the electrode and the cylindrical base member increases. When the voltage to be applied between the electrode and the cylindrical base member is gradually increased and the energy required when the electrons collide with the gas molecules reaches the ionization energy of the gas molecules, the electrons existing between the electrode and the cylindrical base member are increased by the ionization of the gas molecules, and the ionization of the gas molecules due to collision continuously occurs. Thus, discharge begins to take place. The voltage at the time when the discharge begins to take place is referred to as the discharge starting voltage.

Furthermore, if the voltage to be applied between the electrode and the cylindrical base member decreases from the state where the discharge begins to take place, the discharge is not maintained at the time when the voltage becomes smaller than a certain voltage. The lowest voltage at which the discharge is maintained is referred to as the discharge maintaining voltage. The discharge maintaining voltage is generally lower than the discharge starting voltage. This is because, in the state where the discharge has occurred, the number of electrons in the discharge space is larger than that in the state where no discharge has occurred, and if the absolute value of the voltage to be applied between the electrode and the cylindrical base member becomes even less than the absolute value of the discharge starting voltage but is greater than or equal to the absolute value of the discharge maintaining voltage, electrons having energy capable of ionizing gas molecules, the number of which is greater than or equal to the number required to maintain discharge, exist.

In addition, a phenomenon called γ action is also one of the reasons that the discharge maintaining voltage becomes lower than the discharge starting voltage. The γ action is a phenomenon in which when ions produced by ionizing gas molecules collide with the electrode or cylindrical base member, secondary electrons are emitted from them. After discharge has occurred, the electrons produced by the γ action also contribute the ionization of gas molecules. Thus, the discharge can be maintained at a voltage lower than the discharge starting voltage.

In this manner, in the discharge starting voltage and the discharge maintaining voltage, the ionization voltage of the gas molecules and the energy involved when the electrons collide with the gas molecules are dominant factors. The ionization voltage of the gas molecules is determined once a gas species is determined. Further, the energy of the electrons when colliding with the gas molecules is a function of the electric field intensity and the movement distance until the electrons collide with the gas molecules. In other words, the energy is a function of the applied voltage, the distance between the electrode and the cylindrical base member, and the movement distance until the electrons collide with the gas molecules. The movement distance until the electrons collide with the gas molecules is a function of the gas density, or a function of the pressure.

When a mixed gas including a plurality of gas species is used, the mixture ratio of the gas as well as the ionization voltage of each gas is also a factor to define the discharge starting voltage and the discharge maintaining voltage.

Other factors that influence the discharge starting voltage and the discharge maintaining voltage include the surface material, shape, and temperature of the electrode; however, these are less influential than the ionization voltage, the applied voltage, the distance between the electrode and the cylindrical base member, and the pressure.

Accordingly, the discharge starting voltage and the discharge maintaining voltage are different depending on the gas species, the mixture ratio of the gas, the distance between the electrode and the cylindrical base member, and the pressure, and therefore have unique values in accordance with the gas conditions and the configuration of the plasma CVD device to be used. That is, once the plasma CVD device to be used and the gas conditions to be used are determined, the discharge starting voltage and the discharge maintaining voltage are uniquely determined.

In the present invention, causing discharge to occur by either positive or negative electric field rather than the values of the discharge starting voltage and the discharge maintaining voltage, and subsequently obtaining a level in which the discharge is not maintained by an electric field of opposite polarity are important to achieve an advantageous effect. For this reason, the advantages of the present invention can be achieved if the conditions of the present invention are met although the values of the discharge starting voltage and the discharge maintaining voltage change depending on the gas conditions and the configuration of the plasma CVD device to be used. For example, the discharge starting voltage and the discharge maintaining voltage differ between when a mixed gas of a silane gas and a hydrogen gas is used and when a mixed gas of a silane gas, a hydrogen gas, and a methane gas is used. However, in either case, the advantages of the present invention can be achieved by satisfying the conditions of the present invention.

In addition, the larger the value (V2) greater than or equal to the absolute value of the discharge starting voltage, the larger the amount of charge-up of the cylindrical base member, but the higher the density of the charged particles (ions and electrons) in the afterglow. Thus, similar advantages can be achieved regardless of the value (V2) greater than or equal to the absolute value of the discharge starting voltage.

In contrast, the value (V1) less than the absolute value of the discharge maintaining voltage is preferably a value that is 20% or more of the value (V2) greater than or equal to the absolute value of the discharge starting voltage in view of preventing charge-up. The reason for this is considered to be that as the value (V1) less than the absolute value of the discharge maintaining voltage increases, the force to cause the charged particles (ions and electrons) in the afterglow to reach the cylindrical base member increases, resulting in an increase in the density of incidence of charge per unit time to prevent charge-up. However, the condition of 20% or more provides slightly improved effect of preventing charge-up. The reason for this is considered to be that because of the limitation on the amount of charged particles (ions and electrons) in the afterglow, if the force to cause the charged particles to reach the cylindrical base member is increased, a large difference does not occur in the total amount of charged particles that reach the cylindrical base member during the period t1.

Furthermore, the value (V1) less than the absolute value of the discharge maintaining voltage is preferably 95% or less of the absolute value of the discharge maintaining voltage in view of stably achieving the advantages of the present invention. Being 95% or less allows the state less than the absolute value of the discharge maintaining voltage to be maintained if fluctuations in power supply output or temporary fluctuations in electric field in the discharge space due to the stripping of attachment from the inner wall surface of a reactor of the plasma CVD device occur. Thus, the advantages of the present invention can easily be stably achieved.

The determination of whether discharge has begun to take place or not, and whether discharge is maintained or not may be based on, for example, voltage-current characteristics, detected plasma emission, or a similar method.

Figure 4A:
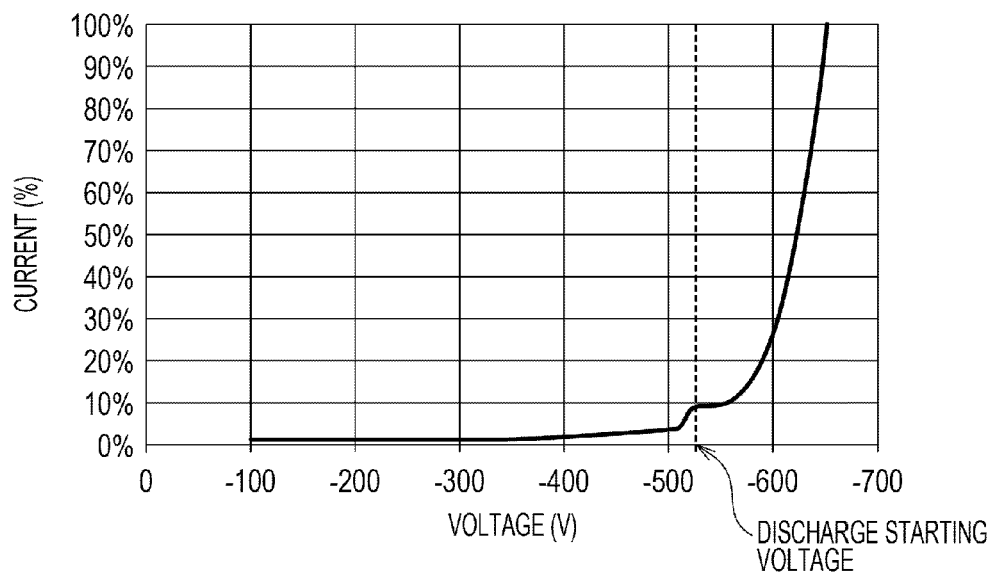
FIG. 4A is a diagram depicting a method for measuring a discharge starting voltage and a discharge maintaining voltage.
Figure 4B:
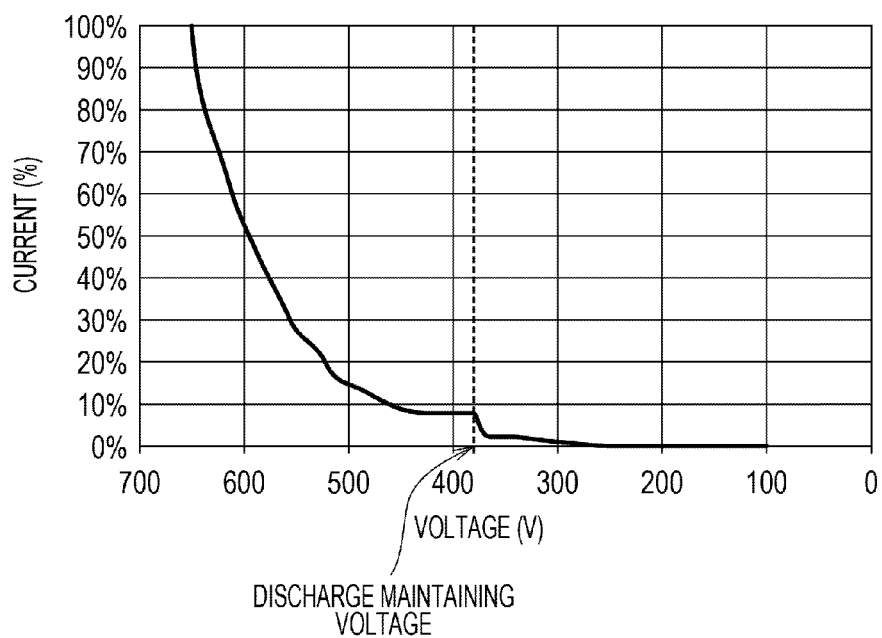
FIG. 4B is a diagram depicting a method for measuring a discharge starting voltage and a discharge maintaining voltage.

FIGS. 4A and 4B are diagrams depicting a method of measuring the discharge starting voltage and the discharge maintaining voltage. FIG. 4A is a diagram illustrating a voltage-current characteristic obtained when the discharge starting voltage is determined using the plasma CVD device illustrated in FIG. 2, by applying a voltage between the electrode and the cylindrical base member. FIG. 4B is a diagram illustrating a voltage-current characteristic obtained when, like FIG. 4A, the discharge maintaining voltage is determined using the plasma CVD device illustrated in FIG. 2. The determination of whether discharge has begun to take place or not and whether or not discharge is maintained or not may be based on the above voltage-current characteristics, and the discharge starting voltage and the discharge maintaining voltage can be determined.

In order to manufacture an electrophotographic photosensitive member by causing discharge to occur when the potential at the cylindrical base member with respect to the potential at the electrode becomes negative, a discharge starting voltage of negative potential as in the example in FIG. 4A and a discharge maintaining voltage of positive potential as in FIG. 4B are determined.

First, a control unit 230 of the plasma CVD device illustrated in FIG. 2 sets the voltage to a voltage (pulse voltage) of a rectangular wave which alternates between 0 V and a set voltage, and controls the output waveform under the conditions of a frequency of 25 kHz and a duty ratio of 30%. Then, the set voltage is increased in steps of 10 V, starting from 0 V toward the negative (0 V→−10 V→−20 V . . . ), and a change in current at each point in time is measured. As illustrated in FIG. 4A, as the set voltage is gradually increased from 0 V toward the negative, the point at which the current abruptly increases is measured. The voltage at this point in time is the discharge starting voltage. While a certain amount of current is measured until the discharge starting voltage is reached, the current is not induced by the discharge, and is dark current caused by the movement of the charged particles existing between the electrode and the cylindrical base member, and leakage current in the plasma CVD device. In FIG. 4A, the current at a set voltage of −650 V is represented by 100%.

Then, as illustrated in FIG. 4B, the set voltage is increased up to +650 V to cause discharge to occur between the electrode and the cylindrical base member. When the set voltage is reduced in steps of 10 V from the above state toward 0 V (+650 V→+640 V→+630 V . . . ), the point at which the current abruptly decreases is measured. The voltage obtained immediately before the current abruptly decreases is the discharge maintaining voltage. In FIG. 4B, the current at a set voltage of +650 V is represented by 100%.

In addition, in view of achieving both productivity and the reduction of charge-up, the duty ratio of the rectangular wave is preferably 20% or more and 80% or less. As the duty ratio increases, the ratio of the period t2 during which the raw material gas is ionized increases, with a tendency for productivity to increase. In contrast, as the duty ratio decreases, the ratio of the period t1 during which the charge-up of the cylindrical base member is reduced increases, with a tendency for the level at which charge-up is reduced to increase. However, the afterglow has a life time and the amount of charged particles (ions and electrons) in the afterglow is also limited. Thus, even if the duty ratio is reduced and the period t1 is extended, the level at which charge-up is reduced at a certain length does not change.

When the frequency is 3 kHz, the period T is more than 333 µs. If the duty ratio reduces and the period t1 becomes long under such a low-frequency condition, the afterglow may disappear in the middle of the period t1. However, since the period t1 is long, the period t2 is reduced and the amount of charge-up of the cylindrical base member during the period t2 is reduced, thus allowing sufficient reduction of charge-up during the life of the afterglow. Further, when the frequency is 300 kHz, the period T is more than 3.3 µs. If the duty ratio increases under such a high-frequency condition, the period t1 is reduced; however, the period t2 is shorter than when the frequency is low, and the amount of charge-up of the cylindrical base member during the period t2 is small, thus allowing sufficient reduction of charge-up.

The present invention has been described with reference to an example in which, mainly, the potential at the electrode is made constant to the ground potential, an alternating voltage of a rectangular wave is applied between the electrode and the cylindrical base member so that the potential at the cylindrical base member with respect to the potential at the electrode becomes alternately positive and negative, and the absolute value of the potential difference between the electrode and the cylindrical base member when the potential at the cylindrical base member with respect to the potential at the electrode becomes positive is equal to the value (V1) less than the absolute value of the discharge maintaining voltage, and the absolute value of the potential difference between the electrode and the cylindrical base member when the potential at the cylindrical base member with respect to the potential at the electrode becomes negative is equal to the value (V2) greater than or equal to the absolute value of the discharge starting voltage. However, the advantages of the present invention can also be achieved in other cases so long as the conditions of the present invention are met. For examples of the other cases, the potential at the electrode may be made constant to a potential other than the ground potential, the potential at the cylindrical base member may be made constant to the ground potential or any other potential, and either of the potential at the electrode and the potential at the cylindrical base member may not be made constant. Furthermore, the absolute value of the potential difference between the electrode and the cylindrical base member when the potential at the cylindrical base member with respect to the potential at the electrode becomes positive may be equal to the value (V2) greater than or equal to the absolute value of the discharge starting voltage, and the absolute value of the potential difference between the electrode and the cylindrical base member when the potential at the cylindrical base member with respect to the potential at the electrode becomes negative may be equal to the value (V1) less than the absolute value of the discharge maintaining voltage.

In the present invention, an electrophotographic photosensitive member is manufactured by forming deposited films on a cylindrical base member (on an outer peripheral surface of the cylindrical base member) using a plasma CVD method. Examples of the deposited films may include a lower charge injection blocking layer, a photoconductive layer, an upper charge injection blocking layer, and a surface layer, and the above layers are generally stacked in sequence from the cylindrical base member side to manufacture an electrophotographic photosensitive member.

The lower charge injection blocking layer is a layer for preventing (blocking) injection of charge into the photoconductive layer from the cylindrical base member, and is formed of, for example, an a-Si-based material.

The photoconductive layer is a layer for allowing charge to be generated by irradiating the electrophotographic photosensitive member with image exposure light such as laser light, and is formed of, for example, an a-Si-based material. The thickness of the photoconductive layer is preferably 5 µm or more and 100 µm or less, and is more preferably 10 µm or more and 60 µm or less.

The upper charge injection blocking layer is a layer for preventing (blocking) injection of the charge on the surface of the electrophotographic photosensitive member when the surface of the electrophotographic photosensitive member is charged into the photoconductive layer, and is formed of, for example, an a-Si-based material. The material of the upper charge injection blocking layer is preferably a-Si with carbon (C), boron (B), nitrogen (N) or oxygen (O). The thickness of the upper charge injection blocking layer is preferably 0.01 µm or more and 1 µm or less.

The surface layer is a layer for protecting the surface of the electrophotographic photosensitive member against abrasion and the like, and is formed of, for example, (hydrogenated) amorphous silicon carbide, (hydrogenated) amorphous silicon nitride, (hydrogenated) amorphous carbon, or the like. Preferably, the surface layer has an optical band gap that is large enough for image exposure light so that the image exposure light to be applied to the electrophotographic photosensitive member is not absorbed. In addition, preferably, the surface layer has a resistance value sufficient to hold an electrostatic latent image (desirably, $10^{11}$ Ω·cm or more).

An electrophotographic photosensitive member can be manufactured by using, for example, the plasma CVD device illustrated in FIG. 2.

The plasma CVD device illustrated in FIG. 2 includes a cylindrical reactor 211 for forming deposited films on the cylindrical base member 212 (upper cylindrical base member 212A, lower cylindrical base member 212B) (outer peripheral surface of the cylindrical base member 212) by using plasma treatment, and a heater 216 for heating the cylindrical base member 212 (212A, 212B). The plasma CVD device further includes base member holders 213A and 213B that hold the cylindrical base member 212 (212A, 212B), and a gas block 235 for introducing a raw material gas into the reactor 211. The gas block 235 has a structure removable (detachable) from the electrode 214.

The gas block 235 and a gas supply system are connected to each other via a joint member 236. With the above configuration, changeovers can be done by replacing only a gas block to provide a reactor having a configuration corresponding to the manufacture of each species.

Figure 3A:
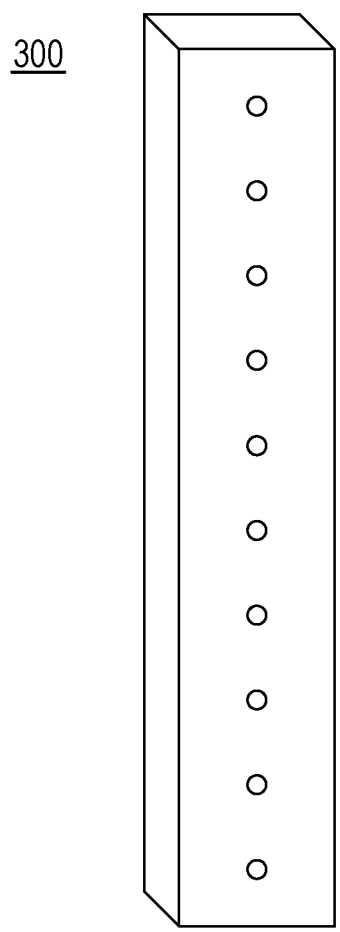
FIG. 3A is a schematic diagram illustrating an example of a gas block that can be used in a manufacturing device (plasma CVD device) for carrying out a method for manufacturing an electrophotographic photosensitive member according to the present invention.
Figure 3B:
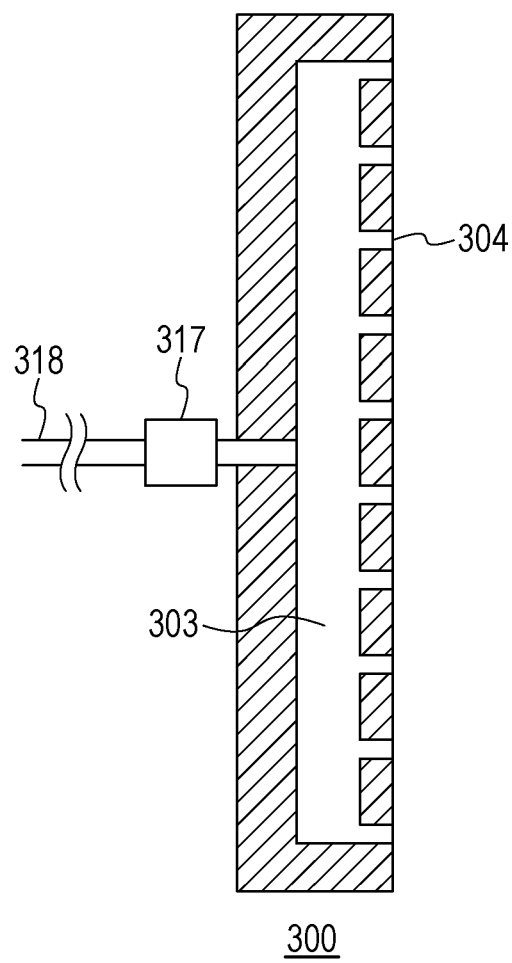
FIG. 3B is a schematic diagram illustrating an example of a gas block that can be used in a manufacturing device (plasma CVD device) for carrying out a method for manufacturing an electrophotographic photosensitive member according to the present invention.
Figure 3C:
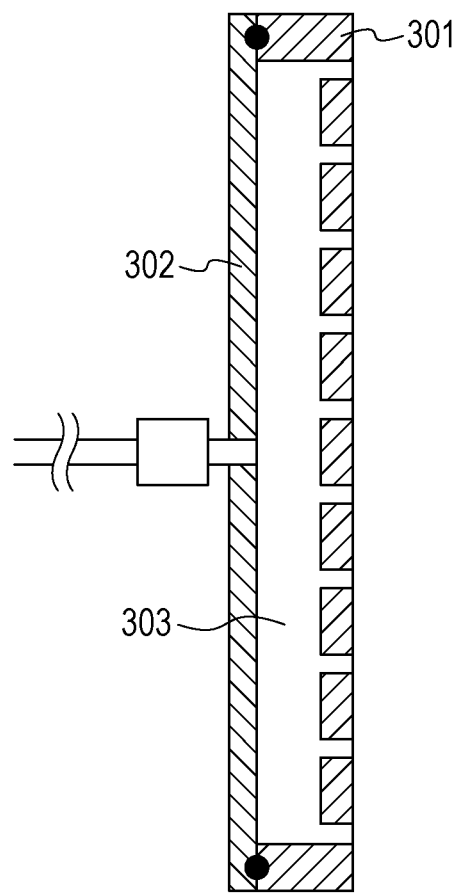
FIG. 3C is a schematic diagram illustrating an example of a gas block that can be used in a manufacturing device (plasma CVD device) for carrying out a method for manufacturing an electrophotographic photosensitive member according to the present invention.
Figure 3D:
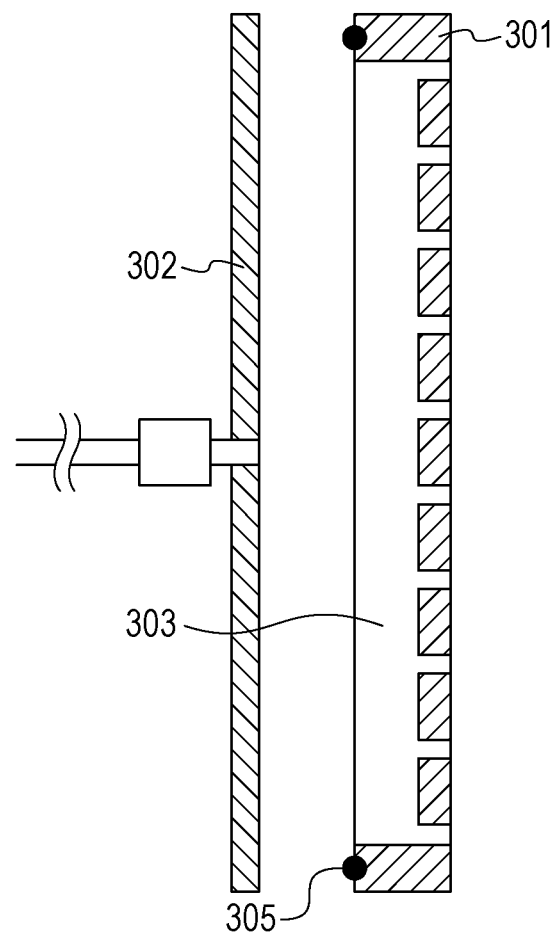
FIG. 3D is a schematic diagram illustrating an example of a gas block that can be used in a manufacturing device (plasma CVD device) for carrying out a method for manufacturing an electrophotographic photosensitive member according to the present invention.

FIGS. 3A to 3D are schematic diagrams illustrating an example of a gas block that can be used for a manufacturing device (plasma CVD device) for carrying out a method for manufacturing an electrophotographic photosensitive member according to the present invention. FIG. 3A is an external view of the gas block, and FIGS. 3B to 3D are cross-sectional views of the gas block. A gas block 300 is constituted by a tubular hollow portion 303, raw material gas emission holes 304, and a raw material gas introducing joint member 317, and is mounted so that the raw material gas emission holes 304 are positioned on the inner surface of the reactor 211. A raw material gas line 318 is connected to the raw material gas introducing joint member 317, thus allowing a raw material gas to be introduced into the reactor 211.

The gas block 235 (300) forms part of the electrode 214 when attached to the reactor 211. The gas block 235 (300) is preferably attached to the reactor 211 so as to have the same potential as the other components of the electrode 214. Accordingly, an entire inner sidewall surface of the reactor 211, including the gas block 235, serves as an electrode, thus allowing a more uniform plasma to be generated. The material of the gas block 235 is preferably a conductive metal, and is more preferably aluminum or stainless steel in view of easiness of processing and cost.

The gas block 235 may be attached using, for example, a method of fixing the gas block 235 by conductive screws.

The shape of the gas block 235 is preferably a shape with small steps with the inner surfaces of the other components of the electrode 214. In addition, the surface of the gas block (the surface on the gas emission hole side) that is flush with the inner surfaces of the other components of the electrode 214 may be flat, and is preferably a curved surface having the same curvature as the inner surfaces of the other components of the electrode 214 if they are curved surfaces. In addition, as illustrated in FIG. 3C, a back plate 302 is provided, and may be configured to be separable from a gas block main body 301.

FIG. 3D is a schematic diagram of a gas block having the main body 301 and the back plate 302, from which the back plate 302 has been removed. The main body 301 and the back plate 302 provide an airtight structure which is secured by O-rings 305. As illustrated in FIG. 3D, removing the back plate 302 makes the tubular hollow portion 303 open and thus makes it easy to clean a gas passage in the gas block. Any residue during the formation of deposited films or any residue not removed during etching, which remains in the gas passage, causes an image defect of the electrophotographic photosensitive member.

Preferably, the gas emission holes of the gas block have a diameter in a range of 0.5 to 2.0 mm. In addition, preferably, each gas emission hole has a precision within ±20% of the diameter. Depending on the precision of the gas emission holes, not only characteristic variations in the longitudinal direction (axial direction) of the electrophotographic photosensitive member but also characteristic variations in the circumferential direction of the electrophotographic photosensitive member, when deposited films are formed while the cylindrical base member is rotated, may be caused.

A portion near the gas emission holes of the gas block is preferably formed using insulating ceramics. Depending on the deposited film forming conditions, due to the gas flow (ejection pressure), plasma concentration may be likely to occur near the gas emission holes. Thus, the use of insulating ceramics is effective to prevent plasma concentration. Since the gas block 235 has a structure removable (detachable) from the electrode 214, the gas block alone can be processed, thus facilitating the processing of embedding tubular ceramic parts near the gas emission holes. Examples of the ceramic material may include alumina, zirconia, mullite, cordierite, silicon carbide, boron nitride, and aluminum nitride. Among them, alumina, boron nitride, or aluminum nitride is preferable in terms of insulation resistance, and alumina is more preferable in terms of cost and processability.

The reactor 211 has an internal space (discharge space) which can be evacuated, which is defined by the electrode 214, a base plate 219, and a top cover 220. The electrode 214 has preferably a constant potential, and more preferably a ground potential (grounded). Making the electrode 214 have a constant potential makes it possible to keep the potential difference between the electrode 214 and the other components in the reactor 211 constant, thereby improving reproducibility of the characteristics of the electrophotographic photosensitive member to be manufactured. In addition, grounding the electrode 214 makes it easy to handle the plasma CVD device. In a case where the base plate 219 and the top cover 220 are grounded and the electrode 214 is not grounded, members having insulating properties are preferably provided between the electrode 214, the base plate 219, and the top cover 220. In the plasma CVD device illustrated in FIG. 2, the electrode 214, the base plate 219, and the top cover 220 are grounded.

In addition, the plasma CVD device illustrated in FIG. 2 includes a raw material gas mixing device 225 incorporating a mass flow controller (not illustrated) for adjusting the flow rate of the raw material gas, and a raw material gas inlet valve 224.

The base member holders 213A and 213B that hold the cylindrical base member 212 (212A, 212B) are rotatably supported. This rotatable support mechanism includes a spindle 222 and a motor 221 connected to the spindle 222 via a gear.

Junction electrodes 217A and 217B are connected to the inside of the base member holders 213A and 213B. The junction electrodes 217A and 217B are connected to the power supply 231 via the spindle 222. The electrode 214, the cylindrical base member 212 (212A, 212B), and the base member holders 213A and 213B are arranged so that their center axes are aligned.

The outer surface of the heater 216 is grounded, and an insulating member 215A is provided between the heater 216 and the cylindrical base member 212 (212A, 212B), thus allowing the heater 216 and the cylindrical base member 212 (212A, 212B) to be insulated. An insulating member 215B is disposed in the heater 216 between the heater 216 and the spindle 222, and the heater 216 and the spindle 222 are insulated.

The plasma CVD device illustrated in FIG. 2 includes an exhaust system having an exhaust pipe 226 communicating with an exhaust port in the reactor 211, an exhaust main valve 227, and a vacuum pump 228. Examples of the vacuum pump include a rotary pump and a mechanical booster pump. The exhaust system allows the user to maintain the internal pressure of the reactor 211 to a predetermined pressure while observing a vacuum gauge 223 provided in the reactor 211.

The output from the power supply 231 is controlled by the control unit 230. The control unit 230 controls the output of the power supply 231, thus enabling an alternating voltage of a rectangular wave having a frequency of 3 kHz or more and 300 kHz or less to be applied between the electrode 214 and the cylindrical base member 212 (212A, 212B).

The discharge space (space which can be evacuated) for forming deposited films is defined by the grounded electrode 214, an insulating plate 218B attached to the grounded base plate 219, and an insulating plate 218A attached to the grounded top cover 220.

The distance D between the cylindrical base member 212 (212A, 212B) and the electrode 214 will be described. If the distance D is 5 mm or more, the influence of the variation of the distance D for each lot, which is caused by a shift in the coaxiality between the cylindrical base member 212 (212A, 212B) and the electrode 214 or the like when the cylindrical base member 212 (212A, 212B) is placed, is unlikely to occur, and therefore stable reproducibility can be easily obtained. However, the larger the distance D, the larger the reactor 211, resulting in productivity per unit installation area being reduced. Thus, the distance D is preferably 5 mm or more and 300 mm or less.

An example of a method for manufacturing an electrophotographic photosensitive member using the plasma device illustrated in FIG. 2 will be described hereinafter.

The cylindrical base member 212 (212A, 212B) whose surface has been mirror-finished using a lathe or the like is attached to the base member holders 213A and 213B, and is disposed in the reactor 211 so as to include the heater 216 for heating the cylindrical base member in the reactor 211.

Then, the raw material gas inlet valve 224 is opened to also exhaust air in the gas supply device, and the exhaust main valve 227 is opened to exhaust air in the reactor 211 and the gas block 235. At the time when the reading of the vacuum gauge 223 reaches a predetermined pressure (e.g., 0.67 Pa or less), an inert gas for heating (e.g., an argon gas) is introduced into the reactor 211 from the gas block 235. Then, the flow rate of the inert gas for heating, the opening of the exhaust main valve 227, the pumping speed of the vacuum pump 228, and so forth are adjusted so that the internal pressure of the reactor 211 becomes a predetermined pressure. After that, a temperature controller (not illustrated) is activated to heat the cylindrical base member 212 (212A, 212B) using the heater 216, and the temperature of the cylindrical base member 212 (212A, 212B) is controlled to a predetermined temperature (e.g., 20 to 500° C.). When the cylindrical base member 212 (212A, 212B) is heated up to the predetermined temperature, the supply of the inert gas is gradually stopped. In parallel to this, a raw material gas for deposited film (amorphous film) formation (e.g., hydrogenated silicon gas such as $SiH_4$ or $Si_2H_6$, or hydrocarbon gas such as $CH_4$ or $C_2H_6$; preferably, at least one is a hydrogenated silicon gas), and a doping gas (e.g., $B_2H_6$, $PH_3$, etc.) are mixed by using the raw material gas mixing device 225, and are then gradually introduced into the reactor 211. Then, each raw material gas is adjusted so as to have a predetermined flow rate by the mass flow controller (not illustrated) in the raw material gas mixing device 225. In this case, the user adjusts the opening of the exhaust main valve 227, the pumping speed of the vacuum pump 228, and so forth so that the internal pressure of the reactor 211 is maintained at a predetermined pressure (e.g., 1 to 100 Pa) while observing the vacuum gauge 223.

After the formation of deposited films has been prepared through the above procedure, deposited films are formed on the cylindrical base member 212 (212A, 212B). Specifically, after it is observed that the internal pressure of the reactor 211 (the internal pressure of the reactor is hereinafter also referred to simply as the "internal pressure") has been stabilized, the power supply 231 is set to a predetermined voltage, and the control unit 230 sets a predetermined frequency and duty ratio. Thus, an alternating voltage of a rectangular wave is applied between the cylindrical base member 212 (212A, 212B) and the electrode 214 through the spindle 222 and the base member holders 213A and 213B to cause glow discharge to occur. The energy of the discharge decomposes each raw material gas introduced into the reactor 211, and a predetermined deposited film is formed on the cylindrical base member 212 (212A, 212B). While a deposited film is being formed, the cylindrical base member 212 (212A, 212B) may be rotated at a predetermined speed by the motor 221.

After a deposited film having a predetermined thickness has been formed, the application of the alternating voltage is stopped, and the introduction of each raw material gas into the reactor 211 is stopped. Then, the inside of the reactor is exhausted to high vacuum. Through the repetition of the above operation, an electrophotographic photosensitive member can be manufactured.

EXAMPLES

The present invention will be described in more detail with reference to examples and comparative examples. However, the present invention is not limited by them.

Example 1 and Comparative Example 1

In Example 1 and Comparative Example 1, the dependency of the electrophotographic characteristics on V1 for the formation of the deposited film of the photoconductive layer was studied, where the potential at the electrode was made constant to the ground potential, the potential at the cylindrical base member with respect to the potential at the electrode becomes alternately positive and negative, the absolute value of the potential difference between the electrode and the cylindrical base member when the potential at the cylindrical base member with respect to the potential at the electrode becomes positive is equal to the value (V1) less than the absolute value of the discharge maintaining voltage, the absolute value of the potential difference between the electrode and the cylindrical base member when the potential at the cylindrical base member with respect to the potential at the electrode becomes negative is equal to the value (V2) greater than or equal to the absolute value of the discharge starting voltage, and the alternating voltage of the rectangular wave to be applied between the electrode and the cylindrical base member has a frequency of 60 kHz and a duty ratio of 50%. Since the potential at the electrode is equal to the ground potential (0 V), V1 and V2 are the same values as the absolute value of the potential at the cylindrical base member obtained when the absolute value of the potential difference between the electrode and the cylindrical base member is V1 and V2, respectively.

A deposited film was formed using the plasma CVD device illustrated in FIG. 2 on a cylindrical base member (an aluminum cylindrical base member which has been mirror-finished to a diameter of 84 mm, a length of 381 mm, and a thickness of 3 mm) under the conditions given in Table 1, and an electrophotographic photosensitive member was manufactured. In this case, the deposited films were formed in order of the lower charge injection blocking layer, the photoconductive layer, the upper charge injection blocking layer, and the surface layer. The discharge starting voltage and the discharge maintaining voltage were those given in Table 1.

V1 for the formation of the deposited film of the photoconductive layer was set to satisfy the conditions given in Table 2. Five batches (five examples), each batch including two electrophotographic photosensitive members, one batch per example, i.e., ten in total, were manufactured. The discharge starting voltage (negative potential) and the discharge maintaining voltage (positive potential) are values measured in advance using the method described above under the reactor internal pressure and gas conditions under which the deposited film of each layer is formed.

TABLE 1

| | Lower charge injection blocking layer | | Photoconductive layer | | Upper charge injection blocking layer | | Surface layer | |
|---|---|---|---|---|---|---|---|---|
| Gas species and flow rate | | | | | | | | |
| $SiH_4$[mL/min (normal)] | 350 | | 450 | | 400 | | 26 | |
| $H_2$[mL/min (normal)] | 750 | | 2200 | | — | | — | |
| $B_2H_6$[ppm] (to $SiH_4$) | — | | — | | 150 | | — | |
| NO [mL/min (normal)] | 30 | | — | | — | | — | |
| $CH_4$[mL/min (normal)] | 500 | | — | | 500 | | 500 | |
| Internal pressure [Pa] | 80 | | 80 | | 80 | | 80 | |
| Temperature of cylindrical base member [° C.] | 260 | | 260 | | 290 | | 290 | |
| Thickness [μm] | 3 | | 35 | | 0.5 | | 0.5 | |
| Frequency [kHz] | 60 | | 60 | | 60 | | 60 | |
| Duty ratio [%] | 50 | | 50 | | 50 | | 50 | |
| | | Polarity | | Polarity | | Polarity | | Polarity |
| V1 [V] | 300 | Positive | See Table 2 | | 350 | Positive | 350 | Positive |
| V2 [V] | 750 | Negative | 900 | Negative | 780 | Negative | 700 | Negative |
| Absolute value of discharge starting voltage [V] | 480 | Negative | 530 | Negative | 600 | Negative | 590 | Negative |
| Absolute value of discharge maintaining voltage [V] | 410 | Positive | 440 | Positive | 530 | Positive | 520 | Positive |

TABLE 2

| | V1 [V] | Polarity |
|---|---|---|
| Example 1-1 | 90 | Positive |
| Example 1-2 | 180 | Positive |
| Example 1-3 | 390 | Positive |
| Comparative Example 1-1 | 440 | Positive |
| Comparative Example 1-2 | 0 | — |

In Table 2, V1 (440 V) in Comparative Example 1-1 is equal to the absolute value (440 V) of the discharge maintaining voltage, and is not accurately V1 but is represented by "V1" for convenience because it is a value to be compared with V1 in Examples. The same applies to the following description.

The ten electrophotographic photosensitive members manufactured in Example 1 and Comparative Example 1 were evaluated using the following method. The evaluation results are given in Table 3.

Image Defects

Evaluation in terms of image defects was made in the following way.

The manufactured electrophotographic photosensitive members were installed in a modified machine of a copying machine (trade name: iRC6800) manufactured by CANON KABUSHIKI KAISHA, which is modified into a negatively charged reversal developing type. In addition, a developing unit of black in the copying machine was removed, and a surface electrometer (a surface electrometer (trade name: Model 344) and a probe (trade name: Model 555-P) manufactured by Trek Inc.) was installed to measure the surface potentials of the electrophotographic photosensitive members.

First, a solid white image (unexposed to laser light for forming an electrostatic latent image) was output, the dark area potentials on the surfaces of electrophotographic photosensitive members were measured, and the primary current and grid voltage of a primary charger were adjusted so that the dark area potentials on the surfaces of the electrophotographic photosensitive members were adjusted to −450 V.

For the exact evaluation in terms of image defects, the image was output under conditions under which spots are likely to occur. Specifically, DC bias conditions in the cyan developing conditions were adjusted, and an image in which fogging (a phenomenon in which toner adheres to a portion that is originally to be a non-image portion by means of a developing operation) occurs was output. The development when the image was output was development using only the developing unit of cyan toner.

The fog density was measured using the following procedure, and an image output in the developing conditions under which the fog density is in a range of 0.4 to 0.8% was used as an evaluation image. The reflectance of the evaluation image was measured, and the reflectance of unused paper was further measured. The value of the reflectance of the evaluation image was subtracted from the value of the reflectance of the unused paper to obtain the fog density. The reflectance was measured with an amber filter attached to a white photometer (trade name: TC-6DS) manufactured by Tokyo Denshoku Co., Ltd.

Image output was performed in a normal temperature/normal humidity environment as a temperature of 23° C./a humidity of 60% RH. The same applies to the following description.

A3 paper (trade name: CS-814 (81.4 g/m$^2$)) manufactured by Canon Marketing Japan Inc. was used as output paper, ten solid white images (unexposed to laser light for forming an electrostatic latent image) were successively output, and the last two were used for evaluation.

The number of spots (cyan spots) (spots which lie outside overlapping 0.05 mm circles) having a size greater than or equal to a circle having a diameter of 0.05 mm in a region given by a portion of an image corresponding to one turn of the electrophotographic photosensitive members (=about 264 mm from the leading edge of paper in the transport direction)×an image area width of 292 mm was counted.

The evaluation was made by counting the number of spots in each of two output images for two electrophotographic photosensitive members in Examples and Comparative Examples, and by calculating the average value of the four evaluation images, where fractions were rounded to integer values.

In addition, ranking was assigned based on the following criteria.

A . . . 8 or less
B . . . 9 or more and 16 or less
C . . . 17 or more and 29 or less
D . . . 30 or more At rank D, it was determined that the advantages of the present invention could not be achieved.

Optical Memory

Evaluation in terms of optical memory was made in the following way.

The manufactured electrophotographic photosensitive members were installed in the modified machine described above, and the surface potentials of the electrophotographic photosensitive members were measured.

First, the dark area potentials on the surfaces of the electrophotographic photosensitive members were measured while the operation of outputting a solid white image (unexposed to laser light for forming an electrostatic latent image) was performed, and the primary current and the grid voltage of the primary charger were adjusted so that the dark area potentials on the surfaces of the electrophotographic photosensitive members were adjusted to −450 V.

Then, the light area potentials on the surfaces of the electrophotographic photosensitive members were measured while the operation of outputting a solid black image (exposed to laser light for forming an electrostatic latent image) was performed, and the amount of laser light for forming an electrostatic latent image was adjusted so that the light area potentials on the surfaces of the electrophotographic photosensitive members were adjusted to −100 V.

Ten solid white images of A3 size, one solid black image of A3 size for one turn of the electrophotographic photosensitive members (a 263-mm portion of A3 is a solid black image, and the other portion is a solid white image), and one solid white image of A3 size, i.e., twelve in total, were consecutively output with the above charge setting and laser exposure setting fixed, and the surface potentials were measured during the consecutive output operation. The surface potential of each of the electrophotographic photosensitive members was measured at seven points in the axial direction of the electrophotographic photosensitive member (±50 mm, ±100 mm, and ±150 mm with respect to 0 mm as the center of the electrophotographic photosensitive member in its axial direction). For the circumferential direction of the electrophotographic photosensitive member, data at 40 points at intervals of 9° was acquired.

After the measurement of the surface potentials, the potential difference at the same position in the circumferential direction of each electrophotographic photosensitive member between the dark area potential obtained one turn prior to the solid black image output operation and the dark area potential obtained one turn subsequent to the solid black image output operation was determined at each position in the axial direction.

Then, the average value of the potential differences at the respective positions in the axial direction was calculated, and the value having the largest potential difference was defined as optical memory. The value in each of Examples and Comparative Examples was the larger one of the values of the two electrophotographic photosensitive members manufactured in one batch.

The smaller the potential difference, the smaller the optical memory, resulting in better electrophotographic characteristics.

In addition, ranking was assigned based on the following criteria.

A . . . 0.0 V or more and less than 1.0 V
B . . . 1.0 V or more and less than 2.0 V
C . . . 2.0 V or more and less than 3.0 V
D . . . 3.0 V or more At rank D, it was determined that a level to which the difference in density on an output image can be clearly observed could be obtained and the advantages of the present invention could not be achieved.

Thickness Uniformity

The thickness of each electrophotographic photosensitive member was measured at the following measurement points.

Nine points at intervals of 2 cm on each side (±2 cm, ±4 cm, ±6 cm, ±8 cm, ±10 cm, ±12 cm, ±14 cm, ±16 cm, and ±18 cm), i.e., 19 in total including a position of 0 cm, were set, where the position of 0 cm represents the position of the center of the electrophotographic photosensitive member in its axial direction, and 12 points at intervals of 30° in the circumferential direction at each position in the axial direction, i.e., 228 points in total, were used as measurement positions. The value obtained by dividing the difference between the maximum value and the minimum value of the thickness at each measurement point by the average thickness was defined as thickness uniformity.

The measurement was made with probe ETA 3.3H attached to FISCHERSCOPE MMS (trade name) manufactured by HELMUT FISCHER GmbH using the eddy current method. The smaller the value, the better the thickness uniformity.

The value of the thickness uniformity in each of Examples and Comparative Examples was the larger one of the values of the two electrophotographic photosensitive members.

In addition, ranking was assigned based on the following criteria.

A . . . Less than 3.0%
B . . . 3.0% or more and less than 4.0%
C . . . 4.0% or more and less than 5.0%
D . . . 5.0% or more At rank D, the difference in density corresponding to the thickness variation may be observed in an output image, and thus it was determined that the advantages of the present invention could not be achieved.

Overall Evaluation

As an overall evaluation, the lowest evaluation rank among the ranks for each of image defect, optical memory, and thickness uniformity is presented as an overall evaluation.

At rank D, it was determined that the advantages of the present invention could not be achieved.

TABLE 3

|  | Image defects [piece] | Optical memory [V] | Thickness uniformity [%] |
| --- | --- | --- | --- |
| Example 1-1 | 15 | 0.8 | 2.8 |
| Example 1-2 | 5 | 0.9 | 1.3 |
| Example 1-3 | 2 | 0.5 | 2.9 |
| Comparative Example 1-1 | 5 | 4.7 | 1.9 |
| Comparative Example 1-2 | 32 | 0.5 | 2.2 |

The evaluation results in terms of image defects given in Table 3, in which the number of image defects is large in Comparative Example 1-2, lead to the finding that the application of only voltages of either polarity would not sufficiently achieve the effect of preventing charge-up.

In addition, in Examples 1-2 and 1-3, in which V1 was set to 20% or more of V2, the number of image defects is smaller than in Example 1-1, in which V1 was set to less than 20% of V2. Thus, it is considered that the effect of preventing charge-up was improved.

The evaluation results in terms of optical memory, in which Comparative Example 1-1 exhibits a large value, lead to the inference that due to the increased amount of substance generated by vapor deposition during the manufacture of the electrophotographic photosensitive member, the characteristics of the deposited films decreased. This may be considered as follows. When V1 becomes greater than or equal to the absolute value of the discharge maintaining voltage, there is no state where the ionization of the raw material gas is stopped, and the plasma state continues. Thus, the reciprocation of the charged particles (ions and electrons) in a plasma was repeated to increase the secondary reactions in the plasma, resulting in an increase in the amount of substance generated by vapor deposition. It is inferred that the substance was taken into the deposited films to reduce the characteristics of the deposited films.

Results of ranking are given in Table 9.

Example 2 and Comparative Example 2

Electrophotographic photosensitive members were manufactured in a manner similar to that in Example 1, except that the frequency when the deposited films of the lower charge injection blocking layer, the photoconductive layer, the upper charge injection blocking layer, and the surface layer are formed was changed to 10 kHz. However, V1 for the formation of the deposited film of the photoconductive layer was set to satisfy the conditions given in Table 5.

In Example 2 and Comparative Example 2, the dependency of the electrophotographic characteristics on V1 for the formation of the deposited film of the photoconductive layer at a frequency of 10 kHz was studied.

Further, the discharge starting voltage and the discharge maintaining voltage were those given in Table 4.

The manufactured two electrophotographic photosensitive members for each condition, i.e., ten in total, were evaluated in a way similar to that in Example 1 and Comparative Example 1.

The evaluation results are given in Table 8.

TABLE 4

|  | Lower charge injection blocking layer | | Photo-conductive layer | | Upper charge injection blocking layer | | Surface layer | |
| --- | --- | --- | --- | --- | --- | --- | --- | --- |
|  |  | Polarity |  | Polarity |  | Polarity |  | Polarity |
| Absolute value of discharge starting voltage [V] | 540 | Negative | 590 | Negative | 660 | Negative | 650 | Negative |
| Absolute value of discharge maintaining voltage [V] | 480 | Positive | 500 | Positive | 600 | Positive | 590 | Positive |

TABLE 5

|  | V1 [V] | Polarity |
| --- | --- | --- |
| Example 2-1 | 90 | Positive |
| Example 2-2 | 180 | Positive |
| Example 2-3 | 390 | Positive |
| Comparative Example 2-1 | 500 | Positive |
| Comparative Example 2-2 | 0 | — |

Example 3 and Comparative Example 3

Electrophotographic photosensitive members were manufactured in a manner similar to that in Example 1, except that the frequency when the deposited films of the lower charge injection blocking layer, the photoconductive layer, the upper charge injection blocking layer, and the surface layer are formed was changed to 100 kHz. However, V1 for the formation of the deposited film of the photoconductive layer was set to satisfy the conditions given in Table 7.

In Example 3 and Comparative Example 3, the dependency of the electrophotographic characteristics on V1 for the formation of the deposited film of the photoconductive layer at a frequency of 100 kHz was studied.

Further, the discharge starting voltage and the discharge maintaining voltage were those given in Table 6.

The manufactured two electrophotographic photosensitive members for each condition, i.e., ten in total, were evaluated in a way similar to that in Example 1 and Comparative Example 1.

The evaluation results are given in Table 8.

TABLE 6

|  | Lower charge injection blocking layer | | Photo-conductive layer | | Upper charge injection blocking layer | | Surface layer | |
| --- | --- | --- | --- | --- | --- | --- | --- | --- |
|  |  | Polarity |  | Polarity |  | Polarity |  | Polarity |
| Absolute value of discharge starting voltage [V] | 460 | Negative | 510 | Negative | 590 | Negative | 580 | Negative |
| Absolute value of discharge maintaining voltage [V] | 390 | Positive | 420 | Positive | 520 | Positive | 510 | Positive |

TABLE 7

|  | V1 [V] | Polarity |
| --- | --- | --- |
| Example 3-1 | 90 | Positive |
| Example 3-2 | 180 | Positive |
| Example 3-3 | 390 | Positive |
| Comparative Example 3-1 | 420 | Positive |
| Comparative Example 3-2 | 0 | — |

TABLE 8

|  | Image defects [piece] | Optical memory [V] | Thickness uniformity [%] |
| --- | --- | --- | --- |
| Example 2-1 | 10 | 0.6 | 2.6 |
| Example 2-2 | 8 | 0.8 | 1.8 |
| Example 2-3 | 8 | 0.7 | 1.3 |
| Comparative Example 2-1 | 2 | 3.4 | 1.2 |
| Comparative Example 2-2 | 32 | 0.5 | 2.2 |
| Example 3-1 | 11 | 0.6 | 3.1 |
| Example 3-2 | 7 | 0.5 | 3.9 |
| Example 3-3 | 4 | 0.4 | 3.1 |
| Comparative Example 3-1 | 4 | 4.2 | 3.0 |
| Comparative Example 3-2 | 53 | 0.9 | 3.0 |

The evaluation results given in Table 8 lead to the finding that the tendencies similar to those of Example 1 and Comparative Example 1 are exhibited.

Results of ranking are given in Table 9.

TABLE 9

| | Frequency [kHz] | V1 [V] | Polarity | Image defects | Optical memory | Thickness uniformity | Overall evaluation |
|---|---|---|---|---|---|---|---|
| Comparative Example 2-2 | 10 | 0 | — | D | A | A | D |
| Comparative Example 1-2 | 60 | | — | D | A | A | D |
| Comparative Example 3-2 | 100 | | — | D | A | B | D |
| Example 2-1 | 10 | 90 | Positive | B | A | A | B |
| Example 1-1 | 60 | | Positive | B | A | A | B |
| Example 3-1 | 100 | | Positive | B | A | B | B |
| Example 2-2 | 10 | 180 | Positive | A | A | A | A |
| Example 1-2 | 60 | | Positive | A | A | A | A |
| Example 3-2 | 100 | | Positive | A | A | B | B |
| Example 2-3 | 10 | 390 | Positive | A | A | A | A |
| Example 1-3 | 60 | | Positive | A | A | A | A |
| Example 3-3 | 100 | | Positive | A | A | B | B |
| Comparative Example 2-1 | 10 | 500 | Positive | A | D | A | D |
| Comparative Example 1-1 | 60 | 440 | Positive | A | D | A | D |
| Comparative Example 3-1 | 100 | 420 | Positive | A | D | B | D |

The evaluation results in terms of image defects given in Table 9, in which Comparative Examples 1-2, 2-2, and 3-2, in which V1=0 V, exhibit rank D as image defect evaluation, lead to the finding that the application of only voltages of either polarity would not achieve the effect of preventing charge-up.

Furthermore, Examples 1-1, 2-1, and 3-1, in which V1 is 100 V, shows a lower evaluation rank in terms of image defects than that in Examples in which V1 is 20% or more of V2. Therefore, it is found that it is preferable that V1 be set to 20% or more of V2 for the effect of improving the image defect level based on prevention of charge-up.

The evaluation results in terms of optical memory, in which Comparative Examples 1-1, 2-1, and 3-1 show rank D, lead to the inference that due to the increased amount of substance generated by vapor deposition, the characteristics of the deposited films decreased. This may be considered as follows. When V1 becomes greater than or equal to the absolute value of the discharge maintaining voltage, there is no state where the ionization of the raw material gas is stopped, and the plasma state continues. Thus, the reciprocation of the charged particles (ions and electrons) in a plasma was repeated to increase the secondary reactions in the plasma, resulting in an increase in the amount of substance generated by vapor deposition. It is inferred that the substance was taken into the deposited films to reduce the characteristics of the deposited films.

It is observed that the thickness uniformity tends to slightly decrease as the frequency becomes as high as 100 kHz; however, it is considered that sufficient thickness uniformity and good discharge uniformity can be obtained.

Example 4 and Comparative Example 4

Deposited films were formed under conditions given in Table 10 with the internal pressure changed to 400 Pa, the frequency changed to 10 kHz, and the duty ratio changed to 80% from that in Example 1 and Comparative Example 1, and electrophotographic photosensitive members were manufactured. V1 for the formation of the deposited film of the photoconductive layer was set to satisfy the conditions given in Table 11.

In Example 4 and Comparative Example 4, the dependency of the electrophotographic characteristics on V1 for the formation of the deposited film of the photoconductive layer at an internal pressure of 400 Pa, a frequency of 10 kHz, and a duty ratio of 80% was studied.

Further, the discharge starting voltage and the discharge maintaining voltage were those given in Table 10.

The manufactured two electrophotographic photosensitive members for each condition, i.e., ten in total, were evaluated in a way similar to that in Example 1 and Comparative Example 1.

The evaluation results are given in Table 14.

TABLE 10

| | Lower charge injection blocking layer | | Photoconductive layer | | Upper charge injection blocking layer | | Surface layer | |
|---|---|---|---|---|---|---|---|---|
| Internal pressure [Pa] | 400 | | 400 | | 400 | | 400 | |
| Frequency [kHz] | 10 | | 10 | | 10 | | 10 | |
| Duty ratio [%] | 80 | | 80 | | 80 | | 80 | |
| | | Polarity | | Polarity | | Polarity | | Polarity |
| V1 [V] | 300 | Positive | See Table 11 | | 350 | Positive | 350 | Positive |
| V2 [V] | 750 | Negative | 1200 | Negative | 850 | Negative | 850 | Negative |
| Absolute value of discharge starting voltage [V] | 640 | Negative | 670 | Negative | 760 | Negative | 750 | Negative |
| Absolute value of discharge maintaining voltage [V] | 580 | Positive | 600 | Positive | 690 | Positive | 680 | Positive |

TABLE 11

| | V1 [V] | Polarity |
|---|---|---|
| Example 4-1 | 120 | Positive |
| Example 4-2 | 240 | Positive |
| Example 4-3 | 480 | Positive |
| Comparative Example 4-1 | 600 | Positive |
| Comparative Example 4-2 | 0 | — |

Example 5 and Comparative Example 5

Electrophotographic photosensitive members were manufactured in a manner similar to that in Example 4, except that the frequency when the deposited films of the lower charge injection blocking layer, the photoconductive layer, the upper charge injection blocking layer, and the surface layer are formed was changed to 60 kHz. However, V1 for the formation of the deposited film of the photoconductive layer was set to satisfy the conditions given in Table 13.

In Example 5 and Comparative Example 5, the dependency of the electrophotographic characteristics on V1 for the formation of the deposited film of the photoconductive layer at an internal pressure of 400 Pa and a frequency of 60 kHz was studied.

Further, the discharge starting voltage and the discharge maintaining voltage were those given in Table 12.

The manufactured two electrophotographic photosensitive members for each condition, i.e., ten in total, were evaluated in a way similar to that in Example 1 and Comparative Example 1.

The evaluation results are given in Table 14.

TABLE 12

|  | Lower charge injection blocking layer | | Photo-conductive layer | | Upper charge injection blocking layer | | Surface layer | |
| --- | --- | --- | --- | --- | --- | --- | --- | --- |
|  |  | Polarity |  | Polarity |  | Polarity |  | Polarity |
| Absolute value of discharge starting voltage [V] | 570 | Negative | 610 | Negative | 700 | Negative | 690 | Negative |
| Absolute value of discharge maintaining voltage [V] | 490 | Positive | 510 | Positive | 600 | Positive | 590 | Positive |

TABLE 13

|  | V1 [V] | |
| --- | --- | --- |
|  |  | Polarity |
| Example 5-1 | 120 | Positive |
| Example 5-2 | 240 | Positive |
| Example 5-3 | 480 | Positive |
| Comparative Example 5-1 | 510 | Positive |
| Comparative Example 5-2 | 0 | — |

TABLE 14

|  | Image defects [piece] | Optical memory [V] | Thickness uniformity [%] |
| --- | --- | --- | --- |
| Example 4-1 | 16 | 1.8 | 1.4 |
| Example 4-2 | 7 | 1.7 | 2.8 |
| Example 4-3 | 6 | 1.8 | 2.0 |
| Comparative Example 4-1 | 5 | 3.4 | 1.0 |
| Comparative Example 4-2 | 57 | 1.8 | 1.1 |
| Example 5-1 | 16 | 1.6 | 1.0 |
| Example 5-2 | 7 | 1.9 | 1.8 |
| Example 5-3 | 4 | 1.5 | 1.4 |
| Comparative Example 5-1 | 4 | 4.7 | 0.9 |
| Comparative Example 5-2 | 43 | 1.3 | 1.7 |

Results of ranking are given in Table 15.

TABLE 15

|  | Image defects | Optical memory | Thickness uniformity | Overall evaluation |
| --- | --- | --- | --- | --- |
| Example 4-1 | B | B | A | B |
| Example 4-2 | A | B | A | B |
| Example 4-3 | A | B | A | B |
| Comparative Example 4-1 | A | D | A | D |
| Comparative Example 4-2 | D | B | A | D |
| Example 5-1 | B | B | A | B |
| Example 5-2 | A | B | A | B |
| Example 5-3 | A | B | A | B |
| Comparative Example 5-1 | A | D | A | D |
| Comparative Example 5-2 | D | B | A | D |

The evaluation results given in Table 15 lead to the finding that Examples 4 and 5 show slightly lower evaluation results in terms of optical memory than Examples 1 and 2. In terms of the others, it is found that Examples 4 and 5 exhibit results similar to those in Examples 1 and 2.

Example 6 and Comparative Example 6

Deposited films were formed under conditions given in Table 16 with the internal pressure changed to 40 Pa, the frequency changed to 10 kHz, and the duty ratio changed to 20% from that in Example 1 and Comparative Example 1, and electrophotographic photosensitive members were manufactured. V1 for the formation of the deposited film of the photoconductive layer was set to satisfy the conditions given in Table 17.

In Example 6 and Comparative Example 6, the dependency of the electrophotographic characteristics on V1 for the formation of the deposited film of the photoconductive layer at an internal pressure of 40 Pa, a frequency of 10 kHz, and a duty ratio of 20% was studied.

Further, the discharge starting voltage and the discharge maintaining voltage were those given in Table 16.

The manufactured two electrophotographic photosensitive members for each condition, i.e., ten in total, were evaluated in a way similar to that in Example 1 and Comparative Example 1.

The evaluation results are given in Table 20.

TABLE 16

|  | Lower charge injection blocking layer | | Photoconductive layer | | Upper charge injection blocking layer | | Surface layer | |
|---|---|---|---|---|---|---|---|---|
| Internal pressure [Pa] | 40 | | 40 | | 40 | | 40 | |
| Frequency [kHz] | 10 | | 10 | | 10 | | 10 | |
| Duty ratio [%] | 20 | | 20 | | 20 | | 20 | |
|  | | Polarity | | Polarity | | Polarity | | Polarity |
| $V1$ [V] | 300 | Positive | See Table 17 | | 350 | Positive | 350 | Positive |
| $V2$ [V] | 750 | Negative | 600 | Negative | 750 | Negative | 700 | Negative |
| Absolute value of discharge starting voltage [V] | 530 | Negative | 570 | Negative | 650 | Negative | 640 | Negative |
| Absolute value of discharge maintaining voltage [V] | 470 | Positive | 510 | Positive | 600 | Positive | 590 | Positive |

TABLE 17

|  | $V1$ [V] | Polarity |
|---|---|---|
| Example 6-1 | 60 | Positive |
| Example 6-2 | 120 | Positive |
| Example 6-3 | 430 | Positive |
| Comparative Example 6-1 | 510 | Positive |
| Comparative Example 6-2 | 0 | — |

Example 7 and Comparative Example 7

Electrophotographic photosensitive members were manufactured in a manner similar to that in Example 6, except that the frequency when the deposited films of the lower charge injection blocking layer, the photoconductive layer, the upper charge injection blocking layer, and the surface layer are formed was changed to 60 kHz. However, $V1$ for the formation of the deposited film of the photoconductive layer was set to satisfy the conditions given in Table 19.

In Example 7 and Comparative Example 7, the dependency of the electrophotographic characteristics on $V1$ for the formation of the deposited film of the photoconductive layer at an internal pressure of 40 Pa and a frequency of 60 kHz was studied.

Further, the discharge starting voltage and the discharge maintaining voltage were those given in Table 18.

The manufactured two electrophotographic photosensitive members for each condition, i.e., ten in total, were evaluated in a way similar to that in Example 1 and Comparative Example 1.

The evaluation results are given in Table 20.

TABLE 18

|  | Lower charge injection blocking layer | | Photo-conductive layer | | Upper charge injection blocking layer | | Surface layer | |
|---|---|---|---|---|---|---|---|---|
|  | | Polarity | | Polarity | | Polarity | | Polarity |
| Absolute value of discharge starting voltage [V] | 460 | Negative | 520 | Negative | 590 | Negative | 580 | Negative |
| Absolute value of discharge maintaining voltage [V] | 400 | Positive | 460 | Positive | 530 | Positive | 520 | Positive |

TABLE 19

|  | $V1$ [V] | Polarity |
|---|---|---|
| Example 7-1 | 60 | Positive |
| Example 7-2 | 120 | Positive |
| Example 7-3 | 430 | Positive |
| Comparative Example 7-1 | 460 | Positive |
| Comparative Example 7-2 | 0 | — |

TABLE 20

|  | Image defects [piece] | Optical memory [V] | Thickness uniformity [%] |
|---|---|---|---|
| Example 6-1 | 13 | 0.6 | 2.6 |
| Example 6-2 | 6 | 0.9 | 2.7 |
| Example 6-3 | 5 | 0.9 | 1.5 |
| Comparative Example 6-1 | 4 | 3.5 | 0.9 |
| Comparative Example 6-2 | 30 | 0.7 | 2.2 |
| Example 7-1 | 14 | 0.6 | 1.1 |
| Example 7-2 | 6 | 0.8 | 1.6 |
| Example 7-3 | 6 | 0.6 | 1.0 |
| Comparative Example 7-1 | 2 | 3.9 | 2.8 |
| Comparative Example 7-2 | 46 | 0.7 | 2.8 |

Results of ranking are given in Table 21.

TABLE 21

|  | Image defects | Optical memory | Thickness uniformity | Overall evaluation |
|---|---|---|---|---|
| Example 6-1 | B | A | A | B |
| Example 6-2 | A | A | A | A |
| Example 6-3 | A | A | A | A |
| Comparative Example 6-1 | A | D | A | D |
| Comparative Example 6-2 | D | A | A | D |
| Example 7-1 | B | A | A | B |
| Example 7-2 | A | A | A | A |
| Example 7-3 | A | A | A | A |
| Comparative Example 7-1 | A | D | A | D |
| Comparative Example 7-2 | D | A | A | D |

The evaluation results given in Table 21 lead to the finding that results similar to those in Examples 1 and 2 are exhibited.

In addition, in Examples 4 to 7, the duty ratio and the internal pressure were changed. Considering the amount of charge-up, the amount of charge-up during one period increases as the duty ratio increases and V2 increases. The reason is that as the period t2 increases and V2 increases, the charge density in the plasma increases and the amount of charge-up increases. In addition, Examples 4 and 5, which shows a high-pressure condition (400 Pa), which results in the reduced life of the afterglow, would also sufficiently achieve the effect of preventing charge-up. In constant, if the internal pressure decreases, the life of the afterglow increases. Thus, a larger number of charge components than those when the internal pressure is high can be attracted, and the effect of preventing charge-up can be easily obtained. Furthermore, as the duty ratio decreases, the amount of charge-up decreases, resulting in the facilitation of the effect of preventing charge-up. In addition, as V2 decreases, the amount of charge-up decreases, resulting in the facilitation of the effect of preventing charge-up.

Example 8 and Comparative Example 8

Deposited films were formed on a cylindrical base member having a different diameter from that in Example 1 (an aluminum cylindrical base member which has been mirror-finished to a diameter of 108 mm, a length of 358 mm, and a thickness of 5 mm) using the same plasma CVD device as that in Example 1 and Comparative Example 1 under conditions given in Table 22, and electrophotographic photosensitive members were manufactured.

In Example 8 and Comparative Example 8, the dependency of the electrophotographic characteristics on V1 for the formation of the deposited film of the photoconductive layer with the reduced distance between the electrode and the cylindrical base member was studied.

V1 for the formation of the deposited film of the photoconductive layer was set to satisfy the conditions given in Table 22. Five batches (five examples), each batch including two electrophotographic photosensitive members, one batch per example, i.e., ten in total, were manufactured.

The manufactured electrophotographic photosensitive members were evaluated using a modified machine of a copying machine (trade name: iR-7086N) manufactured by CANON KABUSHIKI KAISHA, which is modified into a negatively charged reversal developing type. The modified machine is configured to be capable of adjusting the respective voltage conditions of charging, developing, and transferring and the amount of laser light for image exposure. Furthermore, a developing unit of black in the copying machine was removed, and a surface electrometer (a surface electrometer (trade name: Model 344) and a probe (trade name: Model 555-P) manufactured by Trek Inc.) was installed to measure the surface potentials of the electrophotographic photosensitive members.

First, the dark area potentials on the surfaces of the electrophotographic photosensitive members were measured while the operation of outputting a solid white image (unexposed to laser light for forming an electrostatic latent image) was performed, and the primary current and grid voltage of the primary charger were adjusted so that the dark area potentials on the surfaces of the electrophotographic photosensitive members were adjusted to −450 V.

After that, the surface electrometer was removed, and the original developing unit of black was attached.

For the exact evaluation in terms of image defects, the image was output under conditions under which spots are likely to occur. Specifically, DC bias conditions in the black developing conditions were adjusted, and an image in which fogging occurs was output.

Evaluation in terms of image defects was made by counting the number of spots (black spots) (spots which lie outside overlapping 0.05 mm circles) having a size greater than or equal to a circle having a diameter of 0.05 mm in a region given by a portion of an image corresponding to one turn of the electrophotographic photosensitive members (=about 339 mm from the leading edge of paper in the transport direction)×an image area width of 292 mm.

The others were evaluated in a way similar to those in Example 1.

Evaluation in terms of optical memory was made in a manner similar to that in Example 1. However, the modified machine of the copying machine (trade name: iR-7086N) described above was used instead as the evaluation device, and the range of the solid black portion was changed from 263 mm to 339 mm, which is the length of one turn of an electrophotographic photosensitive member having a diameter of 108 mm.

Evaluation in terms of thickness uniformity was made at the following measurement positions since each electrophotographic photosensitive member has a length of 358 mm, and the others were evaluated in a way similar to that in Example 1.

Eight points at intervals of 2 cm on each side (±2 cm, ±4 cm, ±6 cm, ±8 cm, ±10 cm, ±12 cm, ±14 cm, and ±16 cm), i.e., 17 in total including a position of 0 cm, were set, where the position of 0 cm represents the position of the center of the electrophotographic photosensitive member in its axial direction, and 12 points at intervals of 30° in the circumferential direction at each position in the axial direction, i.e., 204 points in total, were used as measurement positions.

The evaluation results are given in Table 24.

TABLE 22

| | Lower charge injection blocking layer | Photoconductive layer | Upper charge injection blocking layer | Surface layer |
|---|---|---|---|---|
| Gas species and flow rate | | | | |
| $SiH_4$[mL/min (normal)] | 350 | 450 | 400 | 26 |
| $H_2$[mL/min (normal)] | 750 | 2200 | — | — |
| $B_2H_6$[ppm] (to $SiH_4$) | — | — | 150 | — |
| NO [mL/min (normal)] | 30 | — | — | — |
| $CH_4$[mL/min (normal)] | 500 | — | 500 | 500 |
| Internal pressure [Pa] | 80 | 80 | 80 | 80 |
| Temperature of cylindrical base member [° C.] | 260 | 260 | 290 | 290 |
| Thickness [μm] | 3 | 35 | 0.5 | 0.5 |
| Frequency [kHz] | 60 | 60 | 60 | 60 |
| Duty ratio [%] | 50 | 50 | 50 | 50 |
| | Polarity | Polarity | Polarity | Polarity |
| V1 [V] | 350 Positive | See Table 23 | 350 Positive | 350 Positive |
| V2 [V] | 600 Negative | 750 Negative | 700 Negative | 700 Negative |
| Absolute value of discharge starting voltage [V] | 460 Negative | 510 Negative | 590 Negative | 570 Negative |
| Absolute value of discharge maintaining voltage [V] | 400 Positive | 430 Positive | 520 Positive | 510 Positive |

TABLE 23

| | V1 [V] | Polarity |
|---|---|---|
| Example 8-1 | 75 | Positive |
| Example 8-2 | 150 | Positive |
| Example 8-3 | 400 | Positive |
| Comparative Example 8-1 | 430 | Positive |
| Comparative Example 8-2 | 0 | — |

TABLE 24

| | Image defects [piece] | Optical memory [V] | Thickness uniformity [%] | Image defects | Optical memory | Thickness uniformity | Overall evaluation |
|---|---|---|---|---|---|---|---|
| Example 8-1 | 9 | 0.6 | 1.0 | B | A | A | B |
| Example 8-2 | 8 | 0.6 | 2.1 | A | A | A | A |
| Example 8-3 | 1 | 0.5 | 1.2 | A | A | A | A |
| Comparative Example 8-1 | 7 | 4.7 | 1.6 | A | D | A | D |
| Comparative Example 8-2 | 45 | 0.3 | 2.9 | D | A | A | D |

Since the diameter of each of the cylindrical base members was changed from 84 mm to 108 mm, the distance between the electrode and the cylindrical base member decreased from 60 mm to 48 mm. The evaluation results given in Table 24 lead to the finding that results similar to those in Example 1 are exhibited.

Example 9

Figure 5A:
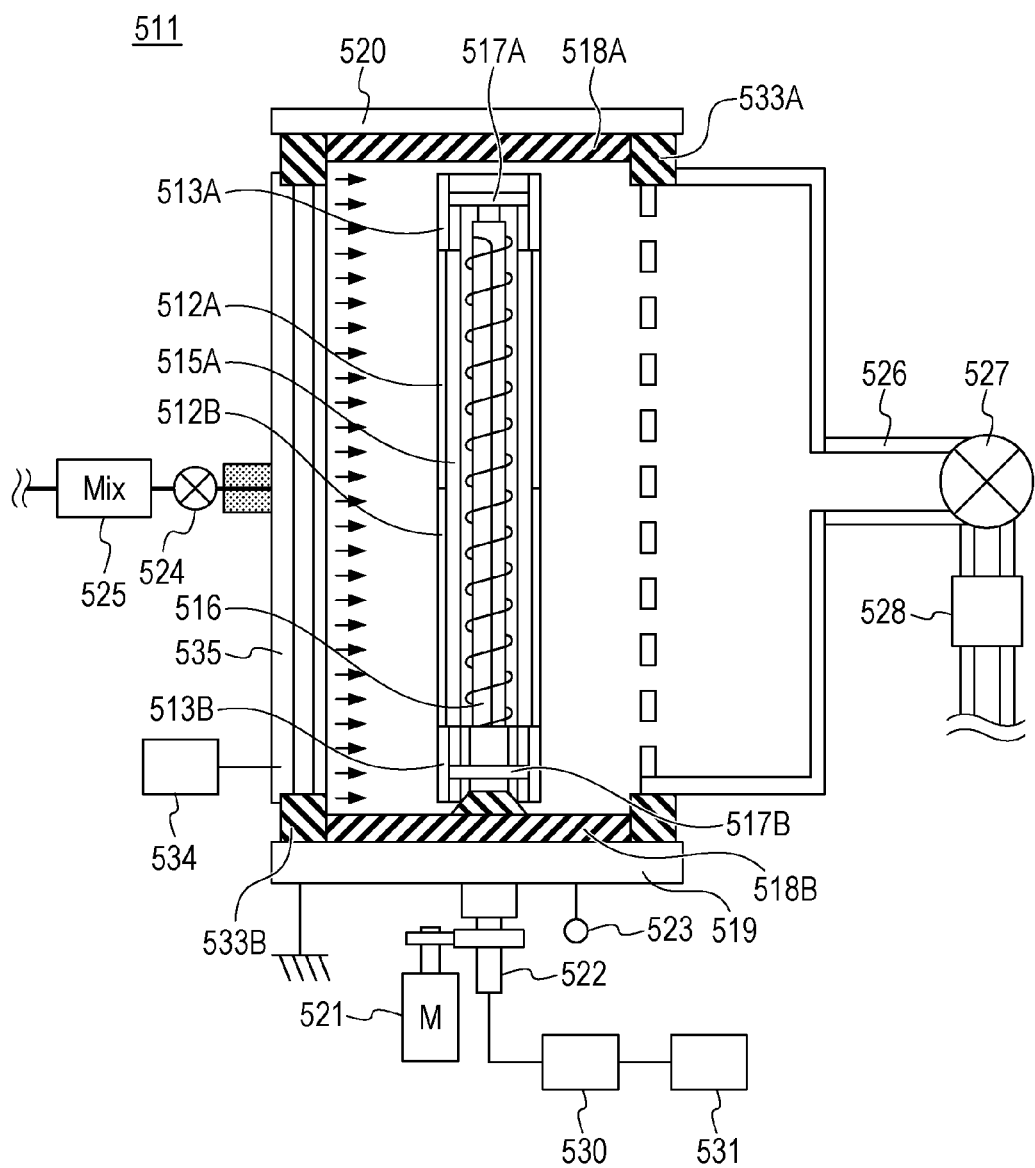
FIG. 5A is a schematic diagram illustrating an example of a manufacturing device (plasma CVD device) for carrying out a method for manufacturing an electrophotographic photosensitive member according to the present invention.
Figure 5B:
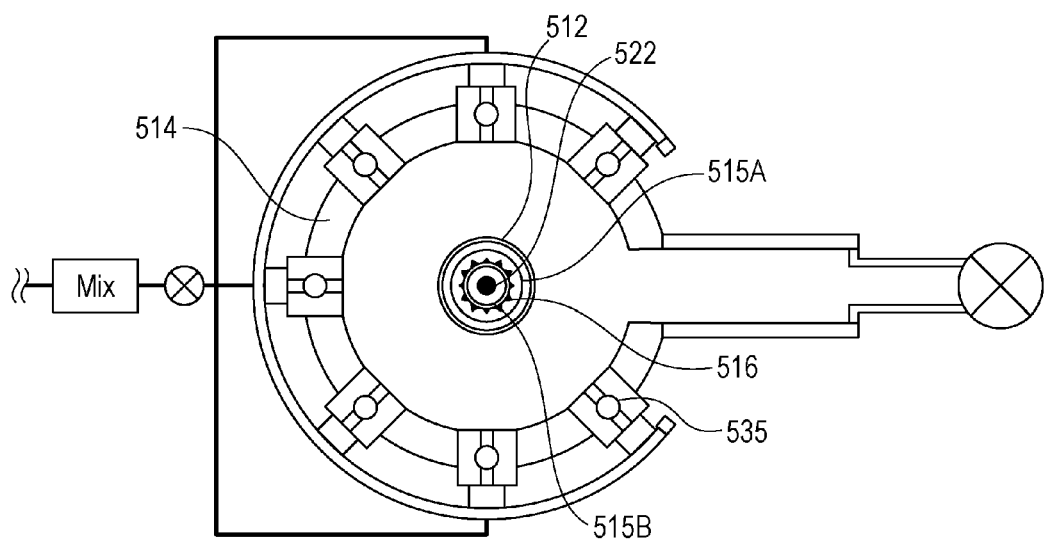
FIG. 5B is a schematic diagram illustrating an example of a manufacturing device (plasma CVD device) for carrying out a method for manufacturing an electrophotographic photosensitive member according to the present invention.

Deposited films were formed on a cylindrical base member (an aluminum cylindrical base member which has been mirror-finished to a diameter of 84 mm, a length of 370 mm, and a thickness of 3 mm) using a plasma CVD device illustrated in FIGS. 5A and 5B (hereinafter also referred to collectively as "FIG. 5") under conditions given in Table 25, and electrophotographic photosensitive members were manufactured.

The temperature, thickness, and frequency of the cylindrical base member at which deposited films of a lower charge injection blocking layer, a photoconductive layer, an upper charge injection blocking layer, and a surface layer are formed were similar to those in Example 1. In FIG. 5, reference numeral 515A denotes an insulating member for insulating a heater 516 and a cylindrical base member 512 (512A, 512B) from each other, and reference numeral 515B denotes an insulating member for insulating the heater 516 and a spindle 522 from each other. Further, reference numerals 517A and 517B denote junction electrodes connected to the inside of base member holders 513A and 513B, reference numeral 518A denotes an insulating plate attached to a top cover 520, and reference numeral 518B denotes an insulating plate attached to a base plate 519. Further, reference numeral 519 denotes a grounded base plate, and reference numeral 520 denotes a grounded top cover. Reference numeral 521 denotes a motor for causing the cylindrical base member 512 (512A, 512B) to rotate at a predetermined speed. Further, reference numeral 523 denotes a vacuum gauge, reference numeral 524 denotes a raw material gas inlet valve, reference numeral 525 denotes a raw material gas mixing device, reference numeral 526 denotes an exhaust pipe communicating with an exhaust port of a reactor 511, reference numeral 527 denotes an exhaust main valve, and reference numeral 528 denotes a vacuum pump. A control unit 530 is a control unit for controlling the output of a power supply 531. Reference numerals 533A and 533B denote vacuum-tight insulating members (vacuum-tight insulating ceramics), and reference numeral 535 denotes a gas block. The elements, unless otherwise noted, function in a manner similar to the elements in the plasma CVD device illustrated in FIG. 2.

In Example 9 and Comparative Example 9, the dependencies when the frequency was changed to 3 kHz, 60 kHz, and 300 kHz were studied.

In the plasma CVD device illustrated in FIG. 5, a direct-current voltage is turned on/off to apply a DC pulse that alternates between a predetermined voltage and 0 V with a rectangular wave to the cylindrical base member 512 (512A, 512B). In addition, a DC voltage is applied to an electrode 514 on the reactor wall surface side from the power supply 534. The above pulse and voltage make the potential at the cylindrical base member with respect to the potential at the electrode alternately positive and negative.

Figure 6A:
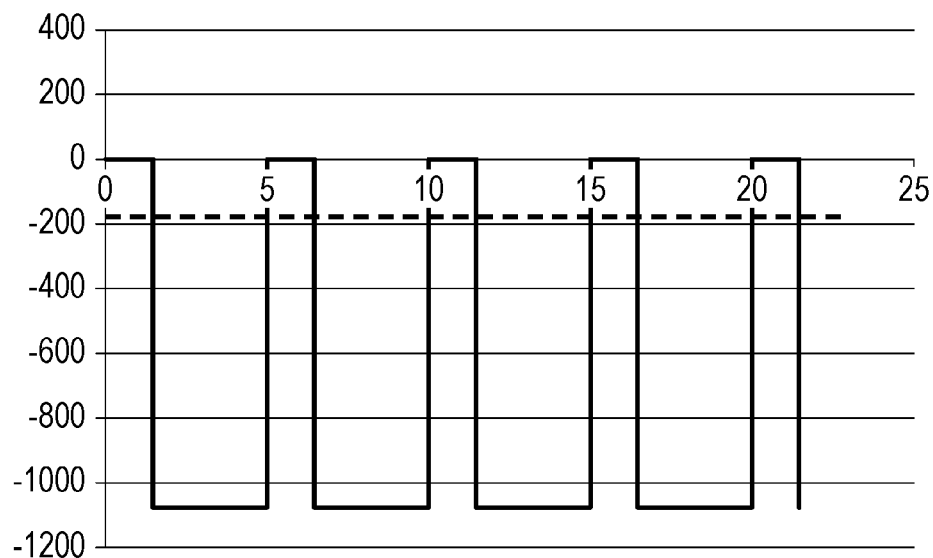
FIG. 6A is a diagram illustrating an example of an alternating voltage of a rectangular wave.
Figure 6B:
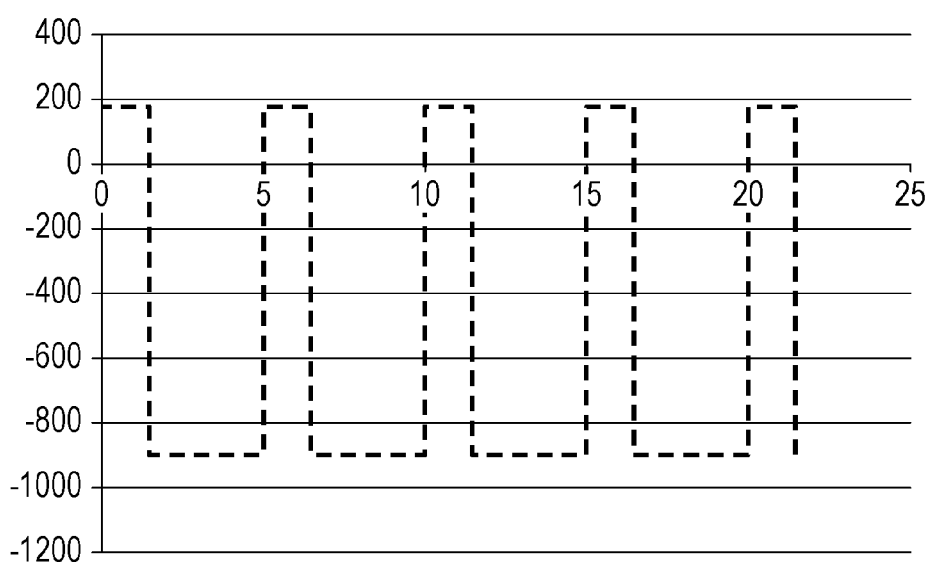
FIG. 6B is a diagram illustrating an example of an alternating voltage of a rectangular wave.

FIGS. 6A and 6B are diagrams illustrating an example of an alternating voltage of a rectangular wave.

FIG. 6A is a diagram illustrating changes in the potential at the cylindrical base member when an alternating voltage of a rectangular wave is applied between the electrode and the cylindrical base member so that the potential at the electrode is made constant to a potential other than the ground potential and the potential at the cylindrical base member with respect to the potential at the electrode becomes alternately positive and negative. A solid line in FIG. 6A indicates the potential at the cylindrical base member, and a broken line in FIG. 6A indicates the potential at the electrode. FIG. 6B is a diagram illustrating changes in the potential difference between the electrode and the cylindrical base member. In FIG. 6B, a broken line indicates the potential difference between the electrode and the cylindrical base member. The discharge starting voltage (negative potential) and the discharge maintaining voltage (positive potential) are values measured in advance using the method described above under the reactor internal pressure and gas conditions under which the deposited film of each layer is formed. The measurement results are given in Table 25.

The frequency and the discharge maintaining voltage for the formation of the deposited film of the photoconductive layer were set to satisfy the conditions given in Table 25. Three batches (three examples), each batch including two electrophotographic photosensitive members, one batch per example, i.e., six in total, were manufactured.

The manufactured electrophotographic photosensitive members were evaluated in a way similar to that in Example 1 and Comparative Example 1.

The evaluation results are given in Table 26.

TABLE 25

| | | Lower charge injection blocking layer | | Photoconductive layer | | Upper charge injection blocking layer | | Surface layer | |
|---|---|---|---|---|---|---|---|---|---|
| | | Gas species and flow rate | | | | | | | |
| | $SiH_4$[mL/min (normal)] | 350 | | 450 | | 400 | | 26 | |
| | $H_2$[mL/min (normal)] | 750 | | 2200 | | — | | — | |
| | $B_2H_6$[ppm] (to $SiH_4$) | — | | — | | 150 | | — | |
| | NO [mL/min (normal)] | 30 | | — | | — | | — | |
| | $CH_4$[mL/min (normal)] | 500 | | — | | 500 | | 500 | |
| | Internal pressure [Pa] | 80 | | 80 | | 80 | | 80 | |
| | Duty ratio [%] | 50 | | 50 | | 50 | | 50 | |
| | | | Polarity | | Polarity | | Polarity | | Polarity |
| | V1 [V] | 300 | Positive | 180 | Positive | 350 | Positive | 350 | Positive |
| | V2 [V] | 750 | Negative | 900 | Negative | 780 | Negative | 700 | Negative |
| Example 9-1 | Frequency [kHz] | | 3 | | 3 | | 3 | | 3 |
| | Absolute value of discharge starting voltage [V] | 570 | Negative | 620 | Negative | 700 | Negative | 690 | Negative |
| | Absolute value of discharge maintaining voltage [V] | 510 | Positive | 540 | Positive | 640 | Positive | 630 | Positive |
| Example 9-2 | Frequency [kHz] | | 60 | | 60 | | 60 | | 60 |
| | Absolute value of discharge starting voltage [V] | 480 | Negative | 530 | Negative | 600 | Negative | 590 | Negative |
| | Absolute value of discharge maintaining voltage [V] | 410 | Positive | 440 | Positive | 530 | Positive | 520 | Positive |
| Example 9-3 | Frequency [kHz] | | 300 | | 300 | | 300 | | 300 |
| | Absolute value of discharge starting voltage [V] | 420 | Negative | 470 | Negative | 550 | Negative | 540 | Negative |
| | Absolute value of discharge maintaining voltage [V] | 330 | Positive | 380 | Positive | 470 | Positive | 460 | Positive |

TABLE 26

| | Image defects [piece] | Optical memory [V] | Thickness uniformity [%] | Image defects | Optical memory | Thickness uniformity | Overall evaluation |
|---|---|---|---|---|---|---|---|
| Example 9-1 | 15 | 0.9 | 2.8 | B | A | A | B |
| Example 9-2 | 4 | 0.5 | 2.2 | A | A | A | A |
| Example 9-3 | 8 | 0.7 | 3.3 | A | A | B | B |

The evaluation results given in Table 26 lead to the finding that Example 9-2 exhibits results similar to those in Example 1-2. Therefore, it is found that even if the voltage application methods differ, the advantages of the present invention can be obtained by satisfying the conditions of the present invention.

In Example 9-1, since the frequency is as low as 3 kHz, the period t2 during one period is long. Thus, it is considered that the amount of charge-up increases, and the number of image defects is slightly larger than that in Example 2-3 or Example 9-2.

In addition, Example 9-3, in which the frequency is 300 kHz, shows slightly reduced thickness uniformity but can obtain the advantages of the present invention.

The present invention is not intended to be limited to the foregoing embodiment, and a variety of changes and modifications can be made without departing from the spirit and scope of the present invention. Therefore, the claims which follow are appended in order to clearly define the scope of the present invention.

By using a method for manufacturing an electrophotographic photosensitive member according to the present invention, it is possible to manufacture an electrophotographic photosensitive member that is favorable in terms of the uniformity of deposited films and the characteristics of the deposited films, with reduced image defects, and capable of high-quality electrophotographic output.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of International Patent Application No. PCT/JP2011/070695, filed Sep. 12, 2011, which is hereby incorporated by reference herein in its entirety.

What is claimed is:

1. A method for manufacturing an electrophotographic photosensitive member using a plasma CVD method, comprising the steps of:
   (i) placing a cylindrical base member in a reactor which can be evacuated, the reactor having an electrode therein, so as to be spaced apart from the electrode;
   (ii) introducing a raw material gas for deposited film formation into the reactor; and
   (iii) applying an alternating voltage of a rectangular wave having a frequency of 3 kHz or more and 300 kHz or less between the electrode and the cylindrical base member so that a potential at the cylindrical base member with respect to a potential at the electrode becomes alternately positive and negative during one period of the rectangular wave, to decompose the raw material gas, and forming a deposited film on the cylindrical base member,
   wherein, when,
   the potential difference between the electrode and the cylindrical base member whose potential with respect to the electrode is the positive, is defined as a first potential difference, and
   the potential difference between the electrode and the cylindrical base member whose potential with respect to the electrode is the negative, is defined as a second potential difference,
   one of the first potential difference and the second potential difference is a value (V1) less than the absolute value of a discharge maintaining voltage, and the other is a value (V2) greater than or equal to the absolute value of a discharge starting voltage, the discharge maintaining voltage being lower than the discharge starting voltage, and
   wherein, when the one period of the rectangular wave is defined as T, a period during which the absolute value of the potential difference between the electrode and the cylindrical base member is the value (V2) is defined as t2, and a value obtained by dividing t2 by T (t2/T) is defined as duty ratio, the duty ratio is 20% or more and 80% or less.

2. The method for manufacturing an electrophotographic photosensitive member according to claim 1, wherein the V1 is a value that is 20% or more of the V2.

3. The method for manufacturing an electrophotographic photosensitive member according to claim 1, wherein the V1 is a value that is 95% or less of the absolute value of the discharge maintaining voltage.

4. The method for manufacturing an electrophotographic photosensitive member according to claim 1, wherein in the step (iii), the potential at the electrode is constant.

5. The method for manufacturing an electrophotographic photosensitive member according to claim 4, wherein in the step (iii), the potential at the electrode is a ground potential.

6. The method for manufacturing an electrophotographic photosensitive member according to claim 1, wherein the rectangular wave is a rectangular wave having a frequency of 10 kHz or more and 100 kHz or less.

7. The method for manufacturing an electrophotographic photosensitive member according to claim 1, wherein at least one species of the raw material gas is a hydrogenated silicon gas, and the deposited film is an amorphous film.

8. The method for manufacturing an electrophotographic photosensitive member according to claim 1, wherein the electrode forms at least part of an inner wall of the reactor.

* * * * *